(12) United States Patent
Umisedo et al.

(10) Patent No.: US 7,655,929 B2
(45) Date of Patent: *Feb. 2, 2010

(54) ION BEAM MEASURING METHOD AND ION IMPLANTING APPARATUS

(75) Inventors: Sei Umisedo, Kyoto (JP); Nariaki Hamamoto, Kyoto (JP); Tadashi Ikejiri, Kyoto (JP); Kohei Tanaka, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 482 days.

This patent is subject to a terminal disclaimer.

(21) Appl. No.: 11/583,830

(22) Filed: Oct. 20, 2006

(65) Prior Publication Data

US 2008/0073579 A1    Mar. 27, 2008

(30) Foreign Application Priority Data

May 23, 2006    (JP) .......................... P.2006-142640

(51) Int. Cl.
G21K 5/10    (2006.01)
H01J 37/08    (2006.01)

(52) U.S. Cl. .............................. 250/492.21; 250/423 R; 250/397; 250/492.2; 250/492.3; 250/426; 250/427; 250/250; 250/251; 257/E21.143

(58) Field of Classification Search ............ 250/492.21, 250/423 R, 397, 492.2, 492.3, 426, 427, 250, 250/251; 257/E21.143
See application file for complete search history.

(56) References Cited

U.S. PATENT DOCUMENTS

| | | | | |
|---|---|---|---|---|
| 6,763,316 B2 * | 7/2004 | Evans | ........................ | 702/134 |
| 7,368,734 B2 * | 5/2008 | Umisedo et al. | ....... | 250/492.21 |
| 2004/0195528 A1 * | 10/2004 | Reece et al. | ........... | 250/492.21 |
| 2007/0023674 A1 | 2/2007 | Umisedo et al. | | |

FOREIGN PATENT DOCUMENTS

| | | | |
|---|---|---|---|
| JP | 0431942 A | * | 11/1992 |
| JP | 2 969 788 | | 11/1999 |
| JP | 3 358 336 | | 12/2002 |

\* cited by examiner

*Primary Examiner*—Meenakshi S Sahu
(74) *Attorney, Agent, or Firm*—Finnegan, Henderson, Farabow, Garrett & Dunner, L.L.P.

(57) ABSTRACT

A change of a beam current of an ion beam which passes an outside of the side of a forestage beam restricting shutter, and which is incident on a forestage multipoints Faraday is measured while the forestage beam restricting shutter is driven in a y direction by a forestage shutter driving apparatus in order to obtain a beam current density distribution in the y direction of the ion beam at a position of the forestage beam restricting shutter. A change of a beam current of the ion beam which passes an outside of the side of a poststage beam restricting shutter, and which is incident on a poststage multipoints Faraday is measured while the poststage beam restricting shutter is driven in the y direction by a poststage shutter driving apparatus in order to obtain a beam current density distribution in the y direction of the ion beam at a position of the poststage beam restricting shutter. By using these results, an angle deviation, a diverging angle, and/or a beam size in the y direction of the ion beam can be obtained.

26 Claims, 9 Drawing Sheets

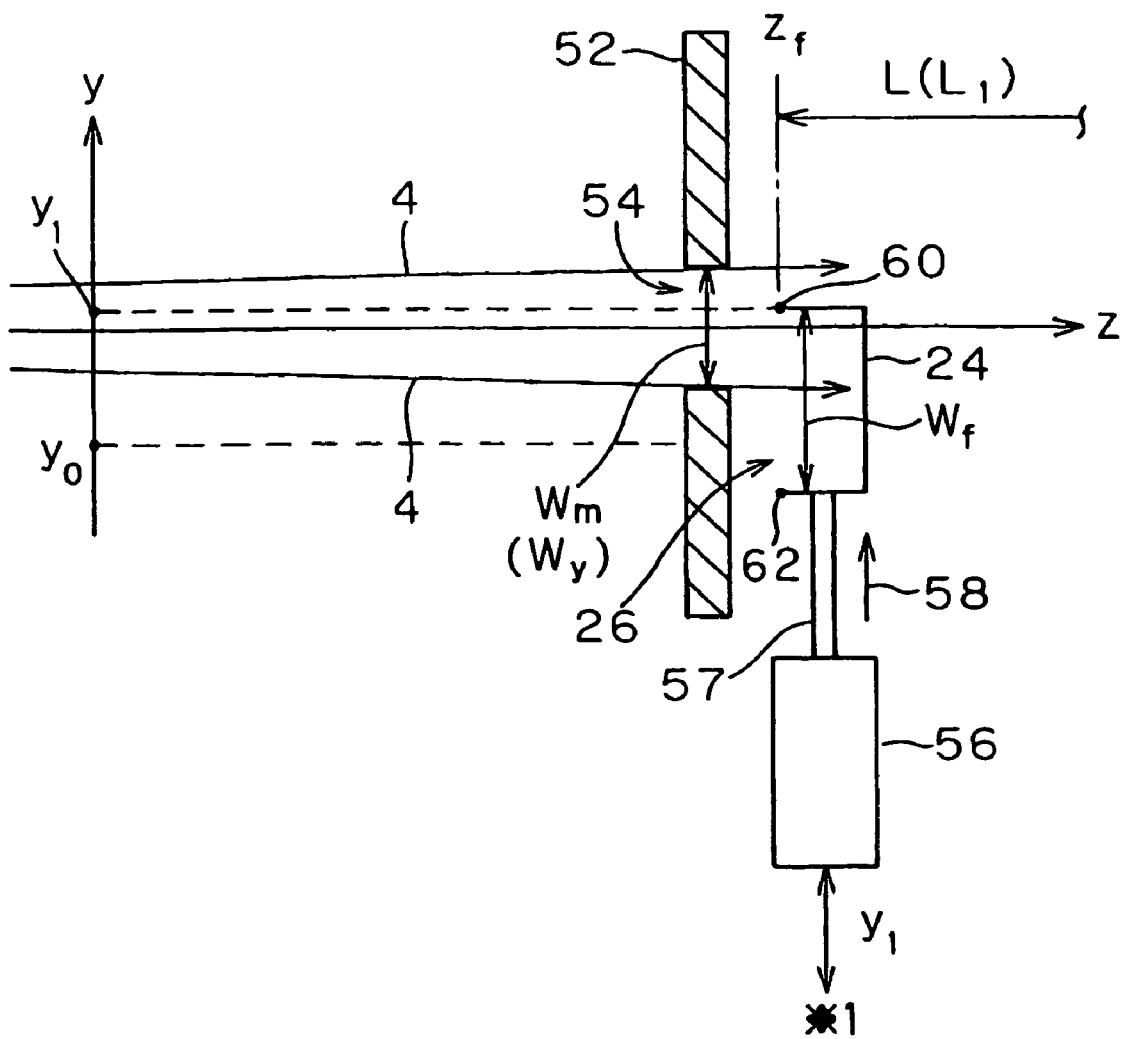

ION BEAM MEASURING METHOD AND ION IMPLANTING APPARATUS

TECHNICAL FIELD

The present disclosure relates to an ion beam measuring method to be performed in an ion implanting apparatus for irradiating, through scanning in x direction, or not through scanning in x direction, a target with an ion beam having a ribbon-like (this may be called a sheet-like or a belt-like) shape where the size in x direction is larger than that in y direction that is substantially orthogonal to the x direction, to measure an angle deviation, a diverging angle, and a size of the ion beam in the y direction, and also to an ion implanting apparatus which can perform the measuring method by using a control apparatus.

RELATED ART

An ion implanting technology holds an important position in a semiconductor fabricating process or the like in recent times.

In implanting ions to a target, for example, a semiconductor substrate, it is known that an implantation characteristic particular in an implantation depth direction is indicated by an implantation angle (incidence angle) relative to a crystal axis of the semiconductor substrate and it is normally requested for the ion implanting technology to enable to execute an ion implanting processing under a condition of preventing the implantation characteristic or positively utilizing the implantation characteristic.

The above-described phenomenon referred to as channeling is provided with a high incidence angle dependency particularly at a vicinity of 0 degree of the incidence angle of ions and therefore, although an incidence angle control with higher accuracy is requested at a vicinity of 0 degree of the incidence angle, the incidence angle control with high accuracy is normally requested at other incidence angle.

Japanese Patent Gazette No. 3358336 (paragraphs 0002, 0003, FIG. 1) (hereinafter, Patent Reference 1) describes an example of an ion implanting apparatus capable of meeting such a request to some degree. FIG. 1 shows an ion implanting apparatus similar to the ion implanting apparatus described in Patent Reference 1.

The ion implanting apparatus is provided with an ion source 2 for generating an ion beam 4, a mass separator 6 on which the ion beam from the ion source 2 is incident and which separates to sample a desired mass of the ion beam 4 from the ion beam 4, an accelerator/decelerator 8 on which the ion beam from the mass separator 6 is incident and which accelerates or decelerates the ion beam 4, an energy separator 10 on which the ion beam 4 from the accelerator/decelerator 8 is incident and which separates to sample a desired energy of the ion beam 4, a scanner 12 on which the ion beam 4 from the energy separator 10 is incident and which scans the ion beam 4 in x direction (for example, horizontal direction), a beam parallelizer 14 on which the ion beam 4 from the scanner 12 is incident and which bends back the ion beam 4 to parallelize to be in substantially parallel with z axis, mentioned later, and a target driving apparatus 20 (refer also to FIG. 7) for mechanically reciprocating to scan (reciprocating to drive) a target (for example, a semiconductor substrate) 16 in y direction (for example, vertical direction) substantially orthogonal to the x direction or mechanically reciprocating to scan (reciprocating to drive) the target substantially in y direction in a region of irradiating the ion beam 4 from the beam parallelizer 14.

Here, the z axis is defined in a direction substantially orthogonal to the x direction (in other words, x axis) and the y direction (in other words, y axis) and in a direction of a trajectory of the ion beam 4 incident on the target 16 in view of design. In the specification, "substantially parallel" includes a parallel state, and "substantially orthogonal" includes an orthogonal state.

The mass separator 6 is, for example, a mass separating electromagnet for separating the mass of the ion beam 4 by a magnetic field. The accelerator/decelerator 8 is, for example, an accelerator/decelerator tube having a plurality of sheets of electrodes for accelerating or decelerating the ion beam 4 by a static electric field. The energy separator 10 is, for example, an energy separating electromagnet for separating the energy of the ion beam 4 by a magnetic field. The scanner 12 is, for example, a scanning electromagnet for scanning the ion beam 4 by a magnetic field or a scanning electrode for scanning the ion beam 4 by an electric field. The beam parallelizer 14 is, for example, a beam parallelizing electromagnet for parallelizing the ion beam 4. For example, also in reference to FIG. 7, the target driving apparatus 20 includes a holder 18 for holding the target 16 and reciprocates to scan the target 16 held by the holder 18 in the y direction or substantially in the y direction as shown by an arrow mark 22.

By the above-described constitution, ion implantation can be carried out uniformly by irradiating the ion beam 4 having the desired mass and the desired energy to the target 16 while scanning the ion beam 4 parallelly in x direction, mechanically reciprocating to scan the target 16 held at a predetermined angle relative to the ion beam 4 in y direction and uniformly irradiating the ion beam 4 to an entire face of the target 16. The type of using both of electromagnetic scanning of the ion beam 4 and mechanical scanning of the target 16 in this way is referred to as hybrid scanning type.

In this case, ideally, inspecting apparatus on a beam line of the ion beam 4, for example, the mass separator 6, the energy separator 10, the scanner 12 and the beam parallelizer 14 are designed to deflect the ion beam one-dimensionally only in x direction and not to deflect the ion beam 4 in y direction. Therefore, a surface of the target is irradiated with the ion beam 4 by a constant incidence angle by accurately controlling a parallelism of the ion beam 4 in x direction.

Here, the incidence angle of the ion beam 4 relative to the target 16 is a relative angle between the target 16 and the ion beam 4, specifically, refers to an angle made by a perpendicular line erected on the surface of the target 16 and the ion beam 4. Explaining further in details, in the incidence angle, there are an incidence angle $\phi_x$ in x direction as in an example shown in FIG. 10A (that is, in x-z plane) and an incidence angle $\phi_y$ in y direction as in an example shown in FIG. 10B (that is, in y-z plane). Numeral 17 designates the perpendicular line. For example, the target 16 shown in FIG. 7 is an example of a case in which the incidence angle $\phi_y$ in y direction is held to be larger than 0 degree similar to the example of FIG. 10B.

As in an example shown in FIG. 2, a parallelism of the ion beam 4 in x direction refers to an angle $\theta_x$ made by a trajectory actually tracked in x-z plane by the scanned and parallelized ion beam 4 and the z axis direction. Therefore, $\theta_x=0°$ in an ideal case in which the scanned and parallelized ion beam 4 tracks a trajectory completely in parallel with z axis. Further, the parallelism $\theta_x$ in the x direction and the incidence angle $\phi_x$ in the x direction are much related to each other.

Further, as in an example shown in FIG. 3, an angle made by a trajectory actually tracked in y-z plane by the scanned and parallelized ion beam 4 and z axis direction is designated by notation $\theta_y$ and is referred to as an angle deviation in y direction of the ion beam 4 in the specification. Therefore, for example, in an ideal case in which the scanned and parallelized ion beam 4 tracks a trajectory completely in parallel with z axis, $\theta_y=0°$. Further, the angle deviation $\theta_y$ in the y direction and the incidence angle $\phi_y$ in the y direction are much related to each other.

Generally, as amounts of characterizing a charged particle beam, or the ion beam 4 in this case, other than a total beam current, there are (a) a center trajectory tracked by a center of the ion beam 4 having a beam current density distribution, (b) a beam size showing spread of the beam current density distribution in a face perpendicular to the center trajectory, (c) a diverging angle representing a shift in a direction of moving respective constituent ions relative to a direction of the center trajectory of the ion beam 4 and the like. A further specific definition thereof will be mentioned later in reference to FIG. 4 through FIG. 6.

When ion implantation is carried by irradiating the ion beam 4 to the target 16, the most important element as the incidence angle of the ion beam 4 is the incidence angle of the center trajectory of the above-described (a) to the target 16. By setting the incidence angle to a desired value, a large portion of ions constituting the ion beam 4 are incident on the target 16 by a desired incidence angle as an average. However, actually, respective ions constituting the ion beam 4 are respectively provided with diverging angles and therefore, incidence angles of respective ions are present with some width at a surrounding of the incidence angle of the center trajectory.

Therefore, when the control of the incidence angle of the ion beam 4 with higher accuracy is requested, it can be said that first, it is important to enable to control the incidence angle of the center trajectory of the ion beam 4 with high accuracy and successively, it is preferable to enable to control the diverging angle with high accuracy.

A technology capable of partially meeting such a request, Japanese Patent Gazette No. 2969788 (sixth paragraph-eleventh paragraph, FIG. 1 through FIG. 9) (hereinafter, Patent Reference 2) describes a technology in which a forestage multipoints Faraday and a poststage multipoints Faraday constituted by respectively aligning pluralities of detectors for measuring a beam current of the ion beam in a direction of scanning the ion beam (for example, the x direction) are respectively provided on an upstream side and a downstream side of a target, in the two multipoints Faradays, at which position in the beam scanning direction the scanning ion beam is disposed at the same time is measured and from a result thereof, a parallelism in the beam scanning direction of the ion beam in a space between the multipoints Faradays (that is, the parallelism $\theta x$ in the x direction) is measured.

A forestage multipoints Faraday 24 illustrated in FIG. 7 corresponds to the above-described forestage multipoints Faraday and a poststage mulipoints Faraday 28 corresponds to the above-described forestage multipoints Faraday. The two multipoints Faradays 24, 28 are respectively provided with the pluralities of detectors (for example, Faraday Cup, not illustrated). In an example of FIG. 7, front sides of the respective detectors are respectively provided with inlets, 26, 30 in a slit-like shape.

The parallelism $\theta x$ in x direction of the ion beam 4 can be measured by using the forestage multipoints Faraday 24 and the poststage multipoints Faraday 28 in accordance with the technology described in Patent Reference 2. Further, the parallelism $\theta x$ in x direction of the ion beam 4 can also be controlled with high accuracy by controlling a drive current or a drive voltage of the beam parallelizer 14 in accordance with the technology described in Patent Reference 2 based on the measurement information. Thereby, the incidence angle $\phi_x$ in x direction of the ion beam 4 can accurately be controlled by accurately aligning the center trajectory of the ion beam 4 in x-z plane in z axis direction.

For example, with higher function formation, finer formation or the like of a semiconductor device, the ion implanting technology tends to be requested to enable to control the incidence angle with higher accuracy such that when a further specific example is printed out, ion implantation having a steep implantation boundary can be realized. For that purpose, it is important to also accurately control the incidence angle of the ion beam 4 in y direction orthogonal to the direction of scanning the ion beam (x direction) which has not been problematic in the background art.

Particularly, with miniaturization of a semiconductor fabricating process, it becomes more and more important in the future to transport the ion beam 4 having low energy to irradiate to the target 16 in order to shallow an ion implanting depth, however, when the energy of the ion beam 4 becomes low, the ion beam 4 tends to be strongly provided with the diverging angle by electric repulsion of ions constituting the ion beam 4 (which is referred to as a space charge effect).

Therefore, in order to control the incidence angle with high accuracy, first, it is important to measure and monitor one, preferably both of the angle deviation $\theta_y$ in y direction orthogonal to the direction of scanning the ion beam 4 and the diverging angle.

Further, for example, the above-described case of the ion implanting apparatus of the hybrid scan type, although normally, a speed of scanning the target 16 in y direction is lower than that in scanning the ion beam 4 in x direction, when the scanning speed in y direction is accelerated in order to promote productivity, there is a high possibility that uniformity of implantation to the target 16 is influenced by a width of distributing the ion beam 4 in y direction (beam size). Particularly, when the beam size in y direction of the ion beam 4 becomes extremely small, the uniformity of implantation is deteriorated and therefore, in order to ensure high implantation uniformity, it is also preferable to measure the beam size in y direction of the ion beam 4 and monitor the beam size on the target 16.

However, when a Faraday measuring system quite separately from the forestage multipoints Faraday and the poststage multipoints Faraday which have been provided in the background art for measuring the parallelism in x direction of the ion beam 4 or the like is newly provided in order to measure the angle deviation $\theta_y$ in y direction, the diverging angle, and the beam size of the ion beam 4, (a) the measuring system is increased, the structure becomes complicated and also cost is considerably increased, (b) in measuring operation, an operation of interchanging the measuring system in x direction and the measuring system in y direction is obliged to be carried out with respect to the beam line of the ion beam 4, a time period required for the interchanging operation becomes an extra time period and the productivity is lowered.

In the example, through high-speed (for example, about several tens of kHz) scanning in x direction (more specifically, parallel scanning), the ion beam 4 irradiating the target 16 has a shape in which, as in an example shown in FIG. 11, the size $W_x$ in x direction is larger (in more detail, sufficiently larger) than the size $W_y$ in y direction that is orthogonal to the x direction. In the specification, also such an ion beam 4 is referred to as an ion beam having a ribbon-like shape. Before scanning, for example, the ion beam 4 is a small rectangular section shape as indicated by the reference numeral 4a in FIG. 11.

By contrast, not through scanning in x direction, the shape itself of the ion beam 4 emitted from the ion source may have a shape in which, as in an example shown in FIG. 12, the size $W_x$ in x direction is larger (in more detail, sufficiently larger) than the size $W_y$ in y direction that is orthogonal to the x direction. In the specification, also such an ion beam 4 is referred as an ion beam having a ribbon-like shape.

In both the cases of the ion beam 4, there are the above-discussed problems with respect to the angle deviation, diverging angle, and size in the y direction of the ion beam.

SUMMARY

Embodiments of the present invention provide an ion beam measuring method which can measure by a simple configuration at least one, preferably foregoing two, and more preferably three of an angle deviation, a diverging angle, and a size in y direction of a ribbon-like ion beam.

Further, embodiments of the present invention provide an ion implanting apparatus which can perform the ion beam measuring method by using a control apparatus.

In an ion beam measuring method and an ion implanting apparatus according to the invention, the forestage multipoints Faraday and the poststage multipoints Faraday are used. Furthermore, a forestage beam restricting shutter which is disposed in a vicinity of an upstream of the forestage multipoints Faraday to block the ion beam, and which has a side that is substantially parallel to the x direction; a forestage shutter driving apparatus which drives the forestage beam restricting shutter in y direction that is substantially orthogonal to the x direction; a poststage beam restricting shutter which is disposed in a vicinity of an upstream of the poststage multipoints Faraday to block the ion beam, and which has a side that is substantially parallel to the x direction; and a poststage shutter driving apparatus which drives the poststage beam restricting shutter in the y direction are disposed.

In a first ion beam measuring method of the invention, a forestage beam current density distribution measuring step of, while driving the forestage beam restricting shutter in the y direction by the forestage shutter driving apparatus, measuring a change of a beam current of the ion beam which passes an outside of the side of the forestage beam restricting shutter, and which is incident on the forestage multipoints Faraday, to obtain a beam current density distribution in the y direction of the ion beam at a position of the forestage beam restricting shutter; a forestage center position calculating step of, from the beam current density distribution obtained in the forestage beam current density distribution measuring step, obtaining a center position $y_{cf}$ in the y direction of the ion beam at the position of the forestage beam restricting shutter; a poststage beam current density distribution measuring step of, while driving the poststage beam restricting shutter in the y direction by the poststage shutter driving apparatus, measuring a change of a beam current of the ion beam which passes an outside of the side of the poststage beam restricting shutter, and which is incident on the poststage multipoints Faraday, to obtain a beam current density distribution in the y direction of the ion beam at a position of the poststage beam restricting shutter; a poststage center position calculating step of, from the beam current density distribution obtained in the poststage beam current density distribution measuring step, obtaining a center position $y_{cb}$ in the y direction of the ion beam at the position of the poststage beam restricting shutter; and an angle deviation calculating step of, using the center position $y_{cf}$ obtained in the forestage center position calculating step, the center position $y_{cb}$ obtained in the poststage center position calculating step, and a distance L between the forestage beam restricting shutter and the poststage beam restricting shutter, obtaining an angle deviation $\theta_y$ in the y direction of the ion beam, based on following Equation 1 or an equation which is mathematically equivalent to the equation are performed.

$$\theta_y = \tan^{-1}\{(y_{cb} - y_{cf})/L\} \quad \text{[Equation 1]}$$

In a second ion beam measuring method of the invention, a forestage beam current density distribution measuring step of, while driving the forestage beam restricting shutter in the y direction by the forestage shutter driving apparatus, measuring a change of a beam current of the ion beam which passes an outside of the side of the forestage beam restricting shutter, and which is incident on the forestage multipoints Faraday, to obtain a beam current density distribution in the y direction of the ion beam at a position of the forestage beam restricting shutter; a forestage beam size calculating step of, from the beam current density distribution obtained in the forestage beam current density distribution measuring step, obtaining a beam size $d_{yf}$ in the y direction of the ion beam at the position of the forestage beam restricting shutter; a poststage beam current density distribution measuring step of, while driving the poststage beam restricting shutter in the y direction by the poststage shutter driving apparatus, measuring a change of a beam current of the ion beam which passes an outside of the side of the poststage beam restricting shutter, and which is incident on the poststage multipoints Faraday, to obtain a beam current density distribution in the y direction of the ion beam at a position of the poststage beam restricting shutter; a poststage beam size calculating step of, from the beam current density distribution obtained in the poststage beam current density distribution measuring step, obtaining a beam size $d_{yb}$ in the y direction of the ion beam at the position of the poststage beam restricting shutter; and a diverging angle calculating step of, using the beam size $d_{yf}$ obtained in the forestage beam size calculating step, the beam size $d_{yb}$ obtained in the poststage beam size calculating step, and a distance L between the forestage beam restricting shutter and the poststage beam restricting shutter, obtaining a diverging angle $\alpha_{max}$ in the y direction of the ion beam, based on following Equation 2 or an equation which is mathematically equivalent to the equation are performed.

$$\alpha_{max} = \tan^{-1}\{(d_{yb} - d_{yf})/2L\} \quad \text{[Equation 2]}$$

In a third ion beam measuring method of the invention, a forestage beam current density distribution measuring step of, while driving the forestage beam restricting shutter in the y direction by the forestage shutter driving apparatus, measuring a change of a beam current of the ion beam which passes an outside of the side of the forestage beam restricting shutter, and which is incident on the forestage multipoints Faraday, to obtain a beam current density distribution in the y direction of the ion beam at a position of the forestage beam restricting shutter; a forestage beam size calculating step of, from the beam current density distribution obtained in the forestage beam current density distribution measuring step, obtaining a beam size $d_{yf}$ in the y direction of the ion beam at the position of the forestage beam restricting shutter; a poststage beam current density distribution measuring step of, while driving the poststage beam restricting shutter in the y direction by the poststage shutter driving apparatus, measuring a change of a beam current of the ion beam which passes an outside of the side of the poststage beam restricting shutter, and which is incident on the poststage multipoints Faraday, to obtain a beam current density distribution in the y direction of the ion beam at a position of the poststage beam restricting shutter; a poststage beam size calculating step of, from the beam current density distribution obtained in the poststage beam current density distribution measuring step, obtaining a beam size $d_{yb}$ in the y direction of the ion beam at the position of the poststage beam restricting shutter; and a beam size calculating step of, from the beam size $d_{yf}$ obtained in the forestage beam size calculating step, the beam size $d_{yb}$ obtained in the poststage beam size calculating step, a distance L between the forestage beam restricting shutter and the poststage beam restricting shutter, a distance $L_1$ between the forestage beam restricting shutter and a target, and a distance $L_2$ between the target and the poststage beam restricting shutter, obtaining a beam size $d_{yt}$ in the y direction of the ion beam on the target, based on following Equation 3 or an equation which is mathematically equivalent to the equation are performed.

$$d_{yt}=(L_2/L)d_{yf}+(L_1/L)d_{yb}\text{ (where }L=L_1+L_2\text{)} \quad \text{[Equation 3]}$$

Furthermore, the forestage beam current density distribution measuring step, the forestage center position calculating step, the poststage beam current density distribution measuring step, the poststage center position calculating step, the angle deviation calculating step, the forestage beam size calculating step, the poststage beam size calculating step, and the diverging angle calculating step may be performed.

Furthermore, the forestage beam current density distribution measuring step, the forestage center position calculating step, the poststage beam current density distribution measuring step, the poststage center position calculating step, the angle deviation calculating step, the forestage beam size calculating step, the poststage beam size calculating step, the diverging angle calculating step, and the beam size calculating step may be performed.

An ion implanting apparatus according to the invention comprises a control apparatus which performs predetermined ones of processes respectively corresponding to the above-mentioned steps.

In the forestage side, instead of driving the forestage beam restricting shutter in the y direction by the forestage shutter driving apparatus, the forestage multipoints Faraday may be driven by a forestage Faraday driving apparatus. Namely, another ion beam measuring method and another ion implanting apparatus according to the invention use the forestage multipoints Faraday and the poststage multipoints Faraday. Furthermore, the forestage faraday driving apparatus which drives the forestage multipoints Faraday in the y direction; a poststage beam restricting shutter which is disposed in a vicinity of an upstream of the poststage multipoints Faraday to block the ion beam, and which has a side that is substantially parallel to the x direction; and a poststage shutter driving apparatus which drives the poststage beam restricting shutter in the y direction are disposed.

In a fourth ion beam measuring method of the invention, a forestage beam current density distribution measuring step of, while driving the forestage multipoints Faraday in the y direction by the forestage Faraday driving apparatus, measuring a change of a beam current of the ion beam which is incident on the forestage multipoints Faraday, to obtain a beam current density distribution in the y direction of the ion beam at a position of an inlet of the forestage multipoints Faraday; a forestage center position calculating step of, from the beam current density distribution obtained in the forestage beam current density distribution measuring step, obtaining a center position $y_{cf}$ in the y direction of the ion beam at the position of the inlet of the forestage multipoints Faraday; a poststage beam current density distribution measuring step of, while driving the poststage beam restricting shutter in the y direction by the poststage shutter driving apparatus, measuring a change of a beam current of the ion beam which passes an outside of the side of the poststage beam restricting shutter, and which is incident on the poststage multipoints Faraday, to obtain a beam current density distribution in the y direction of the ion beam at a position of the poststage beam restricting shutter; a poststage center position calculating step of, from the beam current density distribution obtained in the poststage beam current density distribution measuring step, obtaining a center position $y_{cb}$ in the y direction of the ion beam at the position of the poststage beam restricting shutter; and an angle deviation calculating step of, using the center position $y_{cf}$ obtained in the forestage center position calculating step, the center position $y_{cb}$ obtained in the poststage center position calculating step, and a distance L between the inlet of the forestage multipoints Faraday and the poststage beam restricting shutter, obtaining an angle deviation $\theta_y$ in the y direction of the ion beam, based on above Equation 1 or an equation which is mathematically equivalent to the equation are performed.

In a fifth ion beam measuring method of the invention, a forestage beam current density distribution measuring step of, while driving the forestage multipoints Faraday in the y direction by the forestage Faraday driving apparatus, measuring a change of a beam current of the ion beam which is incident on the forestage multipoints Faraday, to obtain a beam current density distribution in the y direction of the ion beam at a position of an inlet of the forestage multipoints Faraday; a forestage beam size calculating step of, from the beam current density distribution obtained in the forestage beam current density distribution measuring step, obtaining a beam size $d_{yf}$ in the y direction of the ion beam at the position of the inlet of the forestage multipoints Faraday; a poststage beam current density distribution measuring step of, while driving the poststage beam restricting shutter in the y direction by the poststage shutter driving apparatus, measuring a change of a beam current of the ion beam which passes an outside of the side of the poststage beam restricting shutter, and which is incident on the poststage multipoints Faraday, to obtain a beam current density distribution in the y direction of the ion beam at a position of the poststage beam restricting shutter; a poststage beam size calculating step of, from the beam current density distribution obtained in the poststage beam current density distribution measuring step, obtaining a beam size $d_{yb}$ in the y direction of the ion beam at the position of the poststage beam restricting shutter; and a diverging angle calculating step of, using the beam size $d_{yf}$ obtained in the forestage beam size calculating step, the beam size $d_{yb}$ obtained in the poststage beam size calculating step, and a distance L between the inlet of the forestage multipoints Faraday and the poststage beam restricting shutter, obtaining a diverging angle $\alpha_{max}$ in the y direction of the ion beam, based on above Equation 2 or an equation which is mathematically equivalent to the equation are performed.

In a sixth ion beam measuring method of the invention, a forestage beam current density distribution measuring step of, while driving the forestage multipoints Faraday in the y direction by the forestage Faraday driving apparatus, measuring a change of a beam current of the ion beam which is incident on the forestage multipoints Faraday, to obtain a beam current density distribution in the y direction of the ion beam at a position of an inlet of the forestage multipoints Faraday; a forestage beam size calculating step of, from the beam current density distribution obtained in the forestage beam current density distribution measuring step, obtaining a beam size $d_{yf}$ in the y direction of the ion beam at the position of the inlet of the forestage multipoints Faraday; a poststage beam current density distribution measuring step of, while driving the poststage beam restricting shutter in the y direction by the poststage shutter driving apparatus, measuring a change of a beam current of the ion beam which passes an outside of the side of the poststage beam restricting shutter, and which is incident on the poststage multipoints Faraday, to obtain a beam current density distribution in the y direction of the ion beam at a position of the poststage beam restricting shutter; a poststage beam size calculating step of, from the beam current density distribution obtained in the poststage beam current density distribution measuring step, obtaining a beam size $d_{yb}$ in the y direction of the ion beam at the position of the poststage beam restricting shutter; and a beam size calculating step of, from the beam size $d_{yf}$ obtained in the forestage beam size calculating step, the beam size $d_{yb}$ obtained in the poststage beam size calculating step, a distance L between the inlet of the forestage multipoints Faraday and the poststage beam restricting shutter, a distance $L_1$ between the inlet of the forestage multipoints Faraday and a target, and a distance $L_2$ between the target and the poststage beam restricting shutter, obtaining a beam size $d_{yt}$ in the y direction of the ion beam on the target, based on above Equation 3 or an equation which is mathematically equivalent to the equation are performed.

Furthermore, the forestage beam current density distribution measuring step, the forestage center position calculating step, the poststage beam current density distribution measuring step, the poststage center position calculating step, the angle deviation calculating step, the forestage beam size calculating step, the poststage beam size calculating step, and the diverging angle calculating step may be performed.

Furthermore, the forestage beam current density distribution measuring step, the forestage center position calculating step, the poststage beam current density distribution measuring step, the poststage center position calculating step, the angle deviation calculating step, the forestage beam size calculating step, the poststage beam size calculating step, the diverging angle calculating step, and the beam size calculating step may be performed.

Another ion implanting apparatus according to the invention comprises a control apparatus which performs predetermined ones of processes respectively corresponding to the above-mentioned steps.

Various implementations may include one or more the following advantages. For example, according to the inventions of claims 1, 6, 11, 14, 19, and 22, the angle deviation $\theta_y$ in the y direction of the ribbon-like ion beam can be measured. Since the measurement is performed with using the forestage multipoints Faraday and the poststage multipoints Faraday which are disposed in order to measure the parallelism or the like in x direction of the ion beam, it is not necessary to newly dispose a Faraday measuring system. Therefore, the measurement can be performed by a simple configuration. Moreover, a work of interchanging an x-direction measuring system with a y-direction measuring system with respect to the beam line is not necessary. Correspondingly, therefore, an extra time period is shortened, and the productivity is improved.

Both the forestage multipoints Faraday and the poststage multipoints Faraday can conduct the measurement at multiple points in x direction. Therefore, also the distribution of the angle deviation $\theta_y$ in x direction can be measured.

According to the inventions of claims 11, 14, 19, and 22, the forestage faraday driving apparatus which is used for inserting and extracting the forestage multipoints Faraday into and from a path of the ion beam can be used in the measurement of the ion beam. Therefore, the configuration can be simplified.

According to the inventions of claims 2, 7, 12, 15, 20, and 23, the diverging angle $\alpha_{max}$ in the y direction of the ribbon-like ion beam can be measured. Since the measurement is performed with using the forestage multipoints Faraday and the poststage multipoints Faraday which are disposed in order to measure the parallelism or the like in x direction of the ion beam, it is not necessary to newly dispose a Faraday measuring system. Therefore, the measurement can be performed by a simple configuration. Moreover, a work of interchanging an x-direction measuring system with a y-direction measuring system with respect to the beam line is not necessary. Correspondingly, therefore, an extra time period is shortened, and the productivity is improved.

Both the forestage multipoints Faraday and the poststage multipoints Faraday can conduct the measurement at multiple points in x direction. Therefore, also the distribution of the diverging angle $\alpha_{max}$ in x direction can be measured.

According to the inventions of claims 12, 15, 29, and 23, the forestage faraday driving apparatus which is used for inserting and extracting the forestage multipoints Faraday into and from a path of the ion beam can be used in the measurement of the ion beam. Therefore, the configuration can be simplified.

According to the inventions of claims 3, 8, 13, 16, 21, and 24, the beam size $d_{yt}$ in the y direction of the ribbon-like ion beam on the target can be measured. Since the measurement is performed with using the forestage multipoints Faraday and the poststage multipoints Faraday which are disposed in order to measure the parallelism or the like in x direction of the ion beam, it is not necessary to newly dispose a Faraday measuring system. Therefore, the measurement can be performed by a simple configuration. Moreover, a work of interchanging an x-direction measuring system with a y-direction measuring system with respect to the beam line is not necessary. Correspondingly, therefore, an extra time period is shortened, and the productivity is improved.

Both the forestage multipoints Faraday and the poststage multipoints Faraday can conduct the measurement at multiple points in x direction. Therefore, also the distribution of the beam size $d_{yt}$ in x direction can be measured.

According to the inventions of claims 13, 16, 21, and 24, the forestage faraday driving apparatus which is used for inserting and extracting the forestage multipoints Faraday into and from a path of the ion beam can be used in the measurement of the ion beam. Therefore, the configuration can be simplified.

According to the inventions of claims 4, 9, 17, and 25, the angle deviation $\theta_y$ in y direction, and the diverging angle $\alpha_{max}$ in the y direction can be measured by a simple configuration. Because of the same reason as described above, the productivity is improved.

Both the forestage multipoints Faraday and the poststage multipoints Faraday can conduct the measurement at multiple points in x direction. Therefore, also the distribution of the angle deviation $\theta_y$ in x direction can be measured.

According to the inventions of claims 17 and 25, the forestage faraday driving apparatus which is used for inserting and extracting the forestage multipoints Faraday into and from a path of the ion beam can be used in the measurement of the ion beam. Therefore, the configuration can be simplified.

According to the inventions of claims 5, 10, 18, and 26, the angle deviation $\theta_y$ in y direction, the diverging angle $\alpha_{max}$ in the y direction, and the beam size $d_{yt}$ in the y direction on the target can be measured by a simple configuration. Because of the same reason as described above, the productivity is improved.

Both the forestage multipoints Faraday and the poststage multipoints Faraday can conduct the measurement at multiple points in x direction. Therefore, also the distribution of the angle deviation $\theta_y$ in x direction can be measured.

According to the inventions of claims 18 and 26, the forestage faraday driving apparatus which is used for inserting and extracting the forestage multipoints Faraday into and from a path of the ion beam can be used in the measurement of the ion beam. Therefore, the configuration can be simplified.

BRIEF DESCRIPTION OF THE DRAWINGS

FIG. 13 is a diagram partially showing the vicinity of a forestage multipoints Faraday in another embodiment of the ion implanting apparatus which executes the ion beam measuring method of the invention.

DETAILED DESCRIPTION

Figure 1:
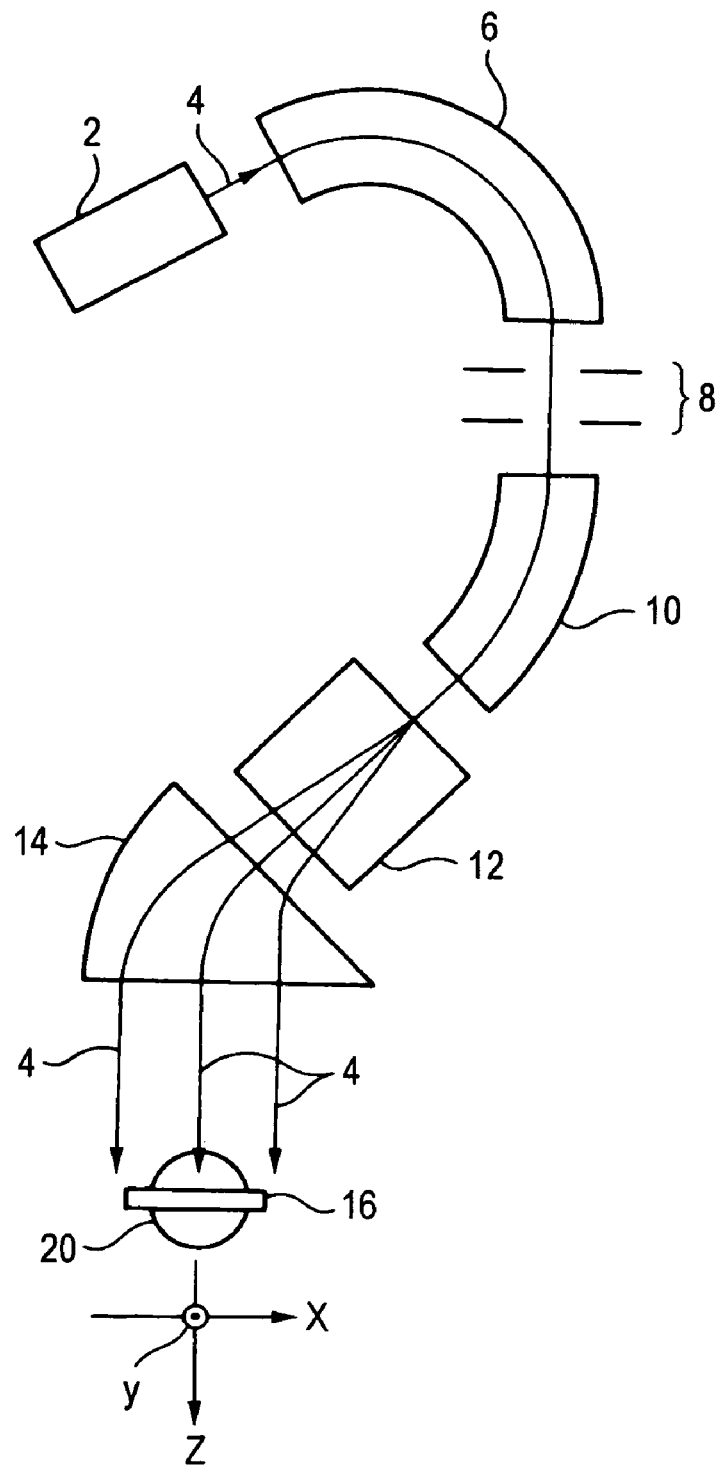
FIG. 1 is a diagram showing an example of a conventional ion implanting apparatus.
Figure 2:
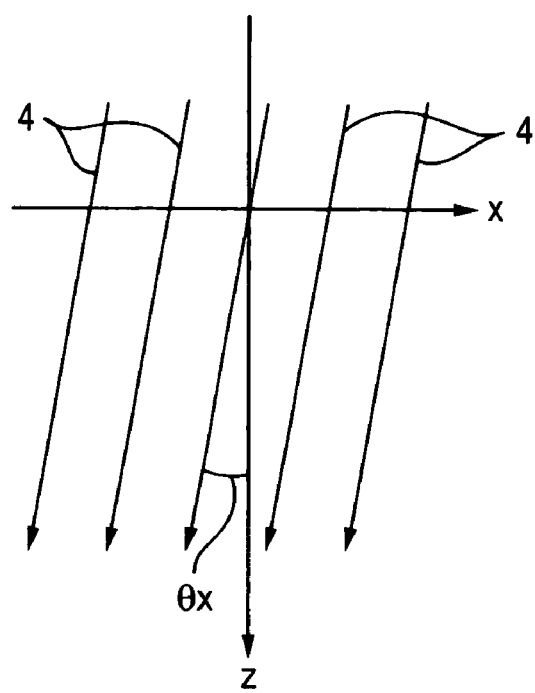
FIG. 2 is a diagram showing an example of a parallelism $\theta_x$ of an ion beam.
Figure 3:
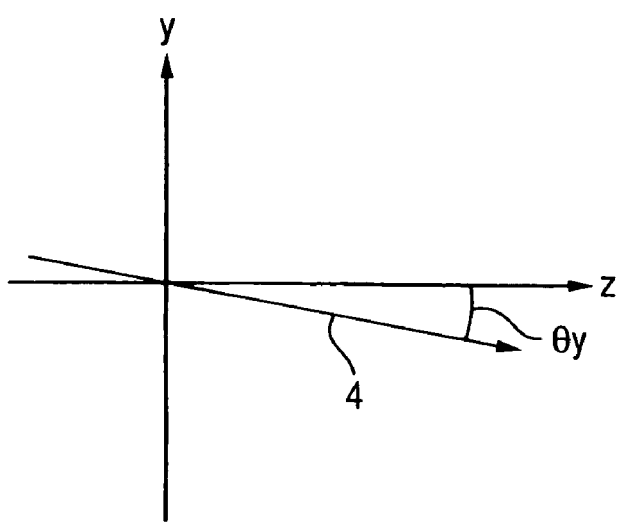
FIG. 3 is a diagram showing an example of an angle deviation in y direction of the ion beam.
Figure 7:
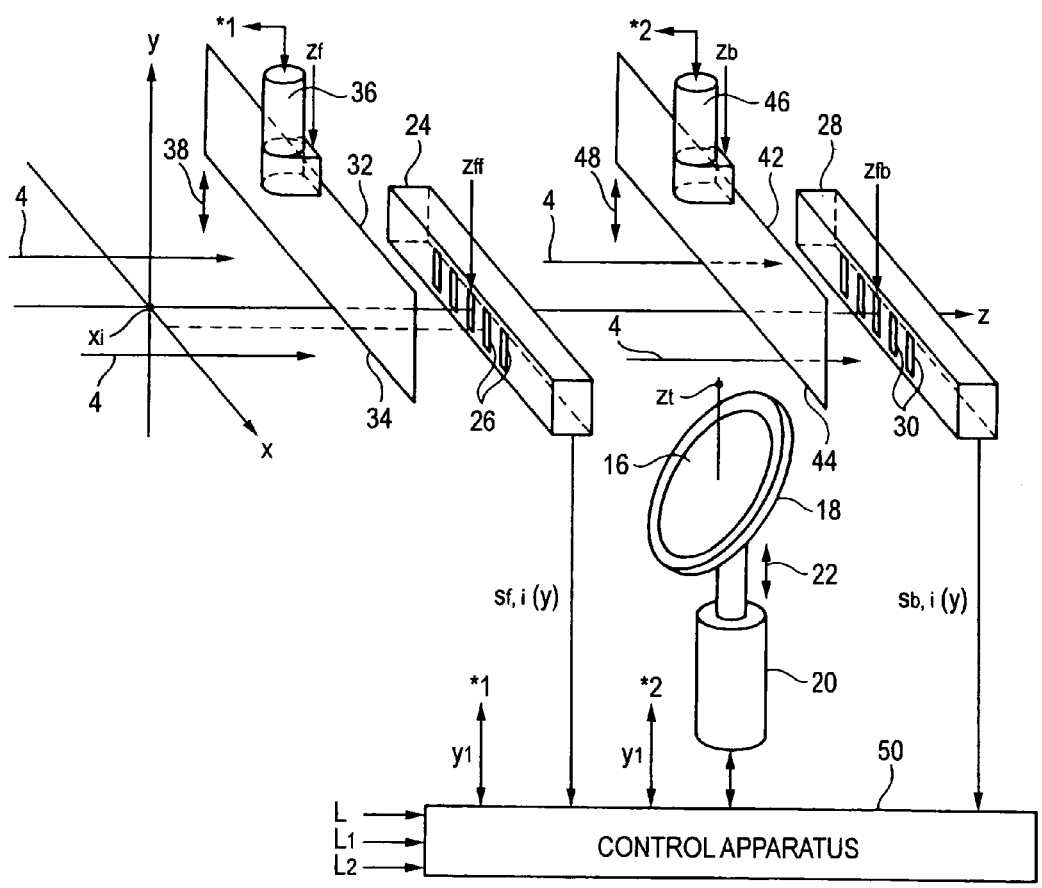
FIG. 7 is a diagram showing main portions of an embodiment of an ion implanting apparatus which executes the ion beam measuring method of the invention.

FIG. 7 is a view showing an essential portion of an embodiment of an ion implanting apparatus for embodying an ion beam measuring method according to the invention. A constitution of a total of the ion implanting apparatus refers to FIG. 1 and the explanation related thereto. Further, portions the same as or corresponding to those in the example shown in FIG. 1 are attached with the same notations and in the following, a difference thereof from those of the above-described example will mainly be explained.

As described above, the ion beam 4 may be an ion beam which is formed into a ribbon-like shape through scanning in x direction, or that which is formed into a ribbon-like shape not through scanning in x direction. Briefly speaking, in both the cases, the width in x direction is large.

The ion implanting apparatus includes the forestage multipoints Faraday 24 at a position $z_{ff}$ on an upstream side of the target 16 and includes the poststage multipoints Faraday 28 at a position $z_{fb}$ on a downstream side of the target 16 with regard to a position on z axis constituting an advancing direction of the ion beam 4. A position on z axis of the target 16 is designated by notation $z_t$. When the target 16 is inclined as in the example shown in FIG. 7, a position on z axis of a center of the target 16 is designated by notation $z_t$.

Further, the forestage beam restricting shutter 32 capable of blocking the ion beam 4 parallelly scanned in the x direction is provided at a position $z_f$ at a vicinity on an upstream side of the forestage mutlipoints Faraday 24. The forestage beam restricting shutter 32 includes the side 34 in parallel with the x direction. It is preferable to maintain the side 34 finely in parallel with the x direction. Although in this example, the forestage beam restricting shutter 32 is constituted by a rectangular shape prolonged in x direction, the shape of the forestage beam restricting shutter 32 is not limited thereto. Further, although in this example, the side 34 is a lower side of the forestage beam restricting shutter 32, the side 34 may be an upper side thereof.

There is provided the forestage shutter driving apparatus 36 for holding the forestage beam restricting shutter 32 and driving to reciprocate the forestage beam restricting shutter 32 in the y direction as shown by an arrow mark 38. In this example, the forestage shutter driving apparatus 36 includes a control circuit for finely controlling a position in y direction of the forestage beam restricting shutter 32 and a position sensor for finely measuring and outputting a position y1 in y direction of the side 34 (illustration of both of which is omitted).

The ion implanting apparatus is further provided with the poststage beam restricting shutter 42 capable of blocking the ion beam 4 parallelly scanned in the x direction at a position $z_b$ at a vicinity on an upstream side of the poststage multipoints Faraday 28, further specifically, at the position $z_b$ on a downstream side of the target 16 and at a vicinity on an upstream side of the poststage multipoints Faraday 28. The poststage beam restricting shutter 42 is provided with the side 44 in parallel with the x direction. It is preferable to maintain the side 44 finely in parallel with the x direction. Although in this example, the poststage beam restricting shutter 42 is constituted by a rectangular shape prolonged in x direction, a shape of the postage beam restricting shutter 42 is not limited thereto. Further, although in this example, the side 44 at a lower side of the poststage beam restricting shutter 42, the side 44 may be an upper side thereof.

There is provided the poststage shutter driving apparatus 46 for holding the poststage beam restricting shutter 42 and reciprocating to drive the poststage beam restricting shutter 42 in the y direction as shown an arrow mark 48. In this example, the poststage shutter driving apparatus 46 includes a control circuit for finely controlling a position in y direction of the poststage beam restricting shutter 42 and a position sensor for finely measuring and outputting a position $y_1$ in y direction of the side 44 (illustration of both of which is omitted). Also in reference to FIG. 6, a distance between the forestage beam restricting shutter 32 and the poststage beam restricting shutter 42 in a direction along z axis, that is, a distance between the position $z_f$ and the position $z_b$ is designated by notation L, a distance between the forestage beam restricting shutter 32 and the target 16, that is, a distance between the position $z_f$ and the position $z_t$ is designated by notation $L_1$, and a distance between the target 16 and the poststage beam restricting shutter 42, that is, a distance between the position $z_t$ and the position $z_b$ is designated by notation $L_2$. Therefore, $L=L_1+L_2$.

The embodiment is further provided with the control apparatus 50 for executing respective processings mentioned later.

The control apparatus 50 respectively drives the forestage beam restricting shutter 32, the poststage beam restricting shutter 42 as described above by respectively controlling the forestage shutter driving apparatus 36, the poststage shutter driving apparatus 46 and respectively receives information of the position $y_1$ from the forestage shutter driving apparatus 36, the poststage shutter driving apparatus 46. Further, the control apparatus 50 respectively receives information of beam currents $S_{f,i}$ (y), $S_{b,i}$ (y) mentioned later from the forestage multipoints Faraday 24, the poststage multipoints Faraday 28.

Further, the control apparatus 50 is provided with information of the distances L, $L_1$ and $L_2$ (for example, set therewith). However, calculation of $L=L_1+L_2$ may be executed in the control apparatus 50 without providing information of the distance L.

Here, definition of the center trajectory in y direction of the ion beam 4, the beam size and the diverging angle in the specification will be explained.

Figure 4:
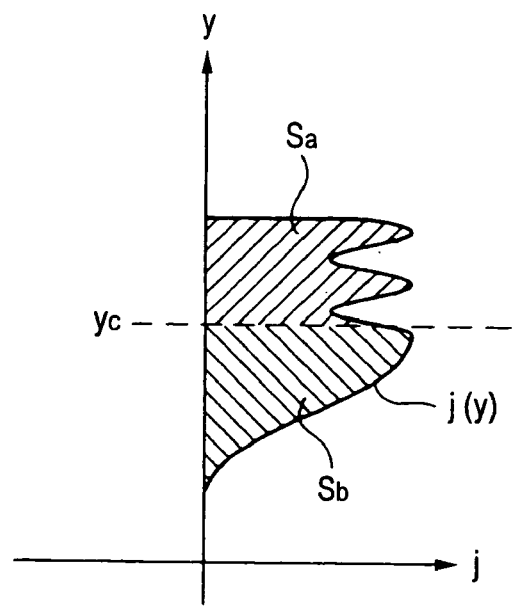
FIG. 4 is a diagram showing an example of a beam current density distribution j(y) in y direction of the ion beam.

FIG. 4 shows an example of a distribution of j (y) of a beam current density j in y direction of the ion beam 4. Generally, the beam current density j (y) is not necessarily limited to be a simple shape and therefore, here, a shape shown in FIG. 4 is taken up as an example. At this occasion, a center position of integration of the beam current density distribution j (y) is designated by notation $y_c$. That is, the center position $y_c$ is a position at which an area $S_a$ on an upper half and an area $S_b$ of a lower half which are hatched in FIG. 4 become equal to each other. A trajectory of the center position $y_c$ of the ion beam 4 is the center trajectory in y direction of the ion beam 4.

When the center position $y_c$ differs between two points remote from each other by a predetermined distance along z axis, specifically, when the center position $y_c$ differs between the position $z_f$ of the forestage beam restricting shutter 32 and the position $z_b$ of the poststage beam restricting shutter 42 (refer to FIG. 6, FIG. 7) which are remote from each other by the distance L, the center trajectory of the ion beam 4 is provided with the angle deviation $\theta_y$ in y direction. In this case, when the center positions $y_c$ of the ion beam 4 at the position $z_f$ of the forestage beam restricting shutter 32 and the position $z_b$ of the poststage beam restricting shutter 42 are respectively designated by notations $y_{cf}$, $y_{cb}$, the angle deviation $\theta_y$ is represented by Equation 1 mentioned above.

Figure 5:
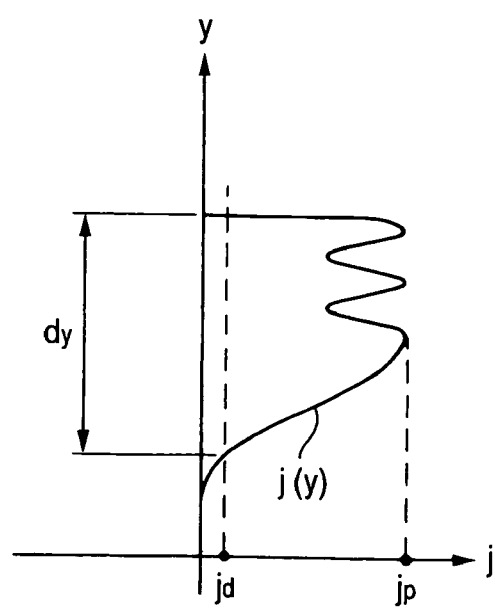
FIG. 5 is a diagram showing an example of a beam size $d_y$ in y direction of the ion beam.

Next, the beam size in y direction of the ion beam 4 will be explained. In the example shown in FIG. 5, a maximum value of a beam current j in the beam current density distribution j (y) is designated by notation $j_p$, and a value thereof of a rate sufficiently smaller than the maximum value $j_p$, for example, 10%. is designated by notation $j_d$. Further, a distance between two points disposed at upper and lower outermost sides in y direction of the beam current density distribution j (y) and at which a value of the beam current j traverses the above-described value $j_d$ is designated by notation $d_y$, $d_y$ is defined as a beam size in y direction of the ion beam 4.

Figure 6:
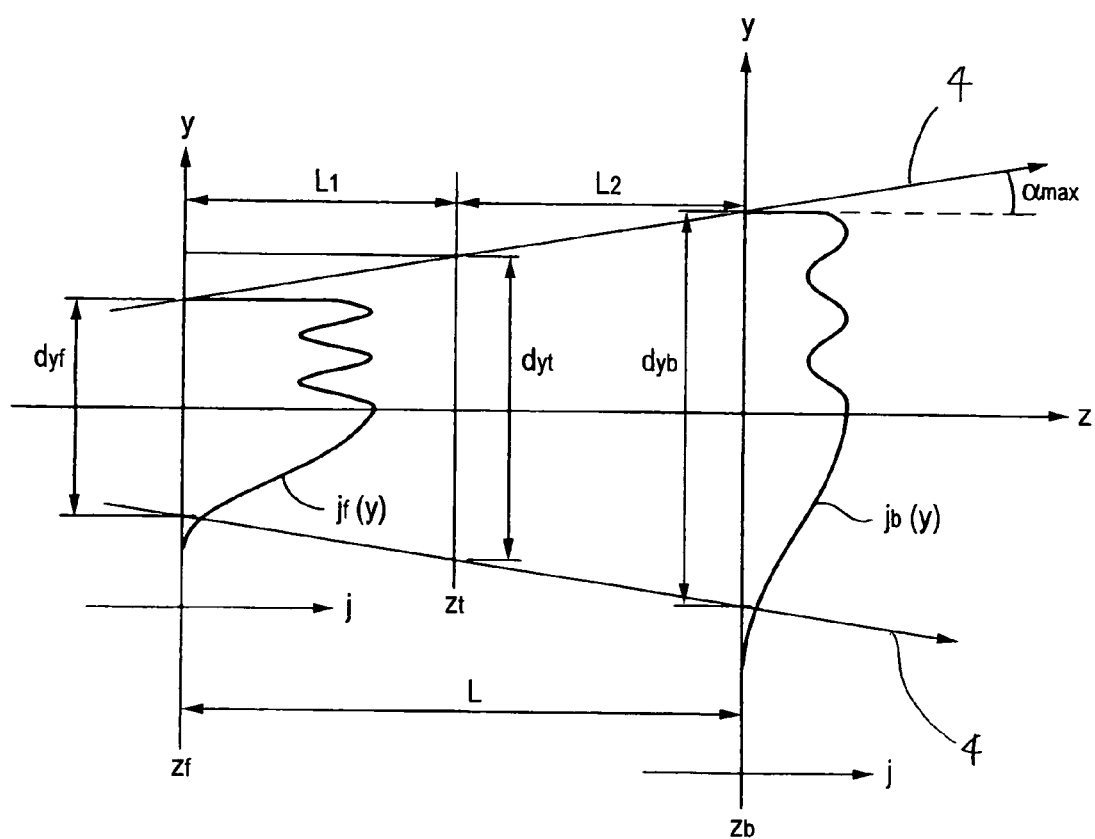
FIG. 6 is a diagram showing an example of a diverging angle $\alpha_{max}$ in y direction of the ion beam.

Next, the diverging angle in y direction of the ion beam 4 will be explained. FIG. 6 shows an example of a beam current density distribution $j_f$ (y) at the position $z_f$ of the forestage beam restricting shutter 32 and an example of a beam current density distribution $j_b$ (y) at the position $z_b$ of the poststage in the restricting shutter 42. Generally speaking, the beam current density distribution j (y) differs by the position on z axis constituting the advancing direction of the ion beam 4 and therefore, also the beam size $d_y$ differs. This is because directions of moving individual ions constituting the ion beam 4 do not necessarily coincide with the direction of the center trajectory of the ion beam 4. Here, the beam size at the position $z_f$ of the forestage beam restricting shutter 32 is designated by notation $d_{yf}$, and the beam size at the position $z_b$ of the poststage in the restricting shutter 42 is designated by notation $d_{yb}$. Therefore when $d_{yf}<d_{yb}$, the ion beam 4 diverges in y direction between the two positions $z_f$, $z_b$ and when $d_{yf}>d_{yb}$, the ion beam 4 converges. When a diverging angle in y direction of the ion beam 4 between the two positions $z_f$, $z_b$ is designated by notation $\alpha_{max}$, the diverging angle $\alpha_{max}$ is represented by Equation 2 mentioned above.

Further, the beam size $d_{yt}$ in y direction on the target 16 is represented by Equation 3 mentioned above.

Next, a method of measuring the angle deviation $\theta_y$, the diverging angle $\alpha_{max}$ and the beam size $d_{yt}$ represented as described above will be explained.

It is preferable to adjust the parallelism $\theta_x$ in x direction of the ion beam 4 to a desired value, for example, $\theta_x \approx 0°$ in accordance with a technology described in, for example, Patent Reference 2 or a technology similar thereto prior to the measurement.

Figure 8:
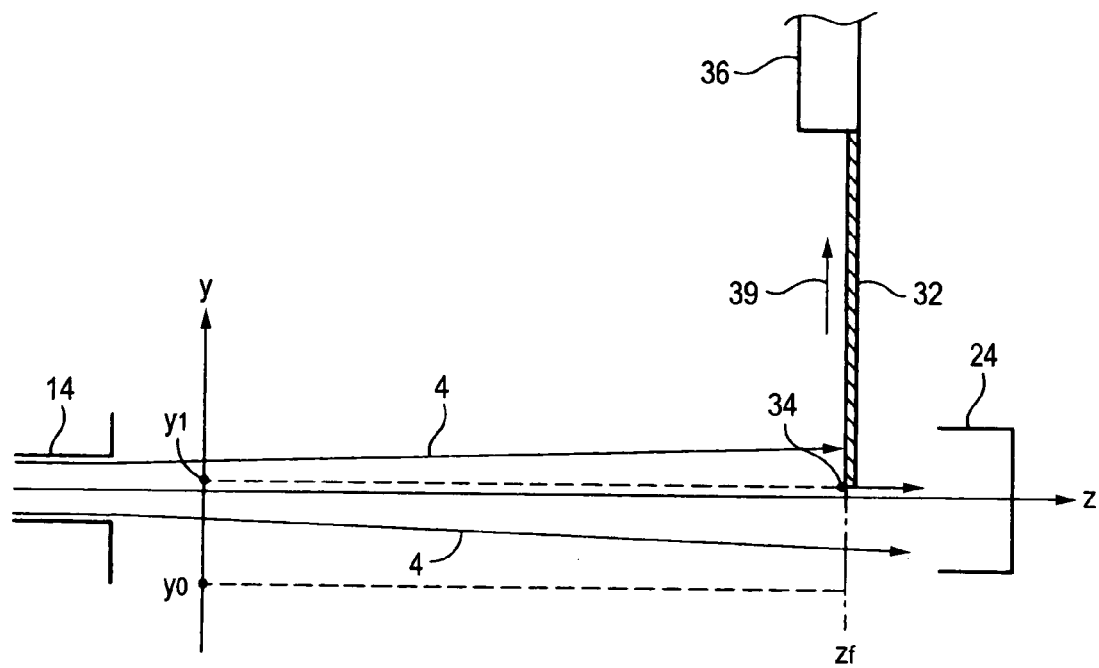
FIG. 8 is a diagram showing an example of a method of measuring a beam current density distribution in y direction at a position of a forestage beam restricting shutter.

In the measurement, as shown by FIG. 8, the forestage multipoints Faraday 24 is disposed on a path of the ion beam 4, the beam current of the ion beam 4 incident on the forestage multipoints Faraday 24 is measured by the forestage multipoints Faraday 24 by driving the forestage beam restricting shutter 32 in y direction by the forestage shutter driving apparatus 36. In driving the forestage beam restricting shutter 32, although the forestage beam restricting shutter 32 may be driven from a state in which the ion beam 4 is not blocked at all to a state of blocking the ion beam 4, here, an explanation will be given by taking an example of driving the forestage beam restricting shutter 32 from a state of completely blocking the ion beam 4 to a state in which the ion beam 4 is not blocked. A direction of driving the forestage beam restricting shutter 32 is designated by an arrow mark 39. In this case, at first, the ion beam 4 is completely blocked by forestage beam restricting shutter 32 and therefore, the ion beam 4 is not incident on the forestage multipoints Faraday 24 at all. A y coordinate position of the side 34 of the forestage beam restricting shutter 32 at this occasion is designated by notation $y_0$.

Further, when the forestage beam restricting shutter 32 is driven in y direction as shown by the arrow mark 39, with progress of driving, a portion of the ion beam 4 which has been blocked by the forestage beam restricting shutter 32 is gradually incident on the forestage multipoints Faraday 24 by passing an outer side of the side 34. Here, a y coordinate position of the side 34 of the forestage beam restricting shutter 32 when at least a portion of the ion beam 4 is incident on the forestage multipoints Faraday 24 is designated by notation $y_1$.

Figure 9:
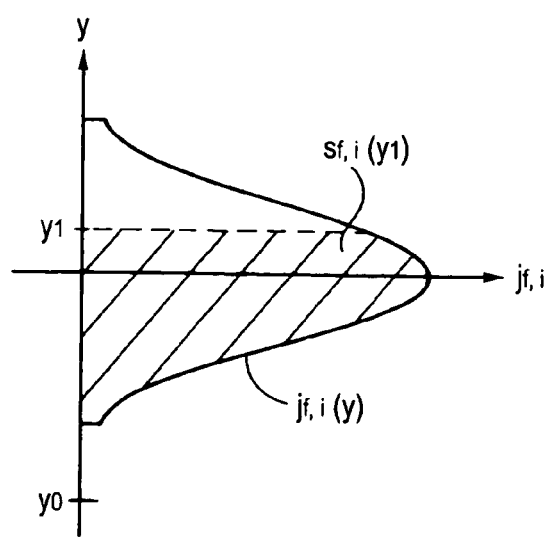
FIG. 9 is a diagram showing an example of the beam current density distribution in y direction at the position of the forestage beam restricting shutter.
Figure 10A:
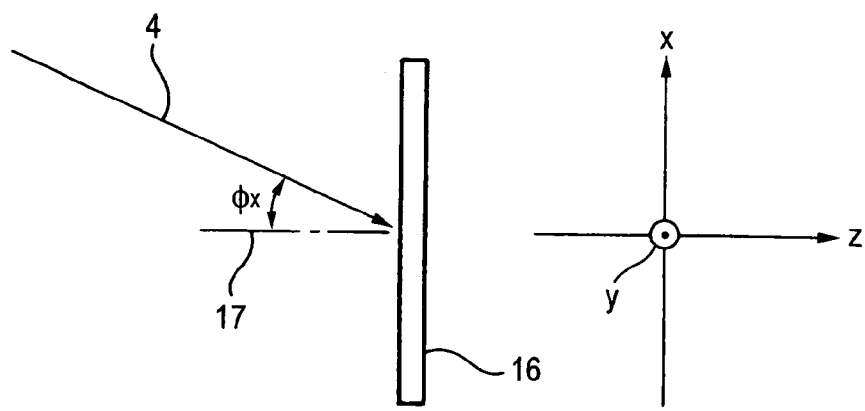
FIG. 10A is a diagram showing an example of an incidence angle of the ion beam on a target and shows an incidence angle $\Phi_x$ in x direction.
Figure 10B:
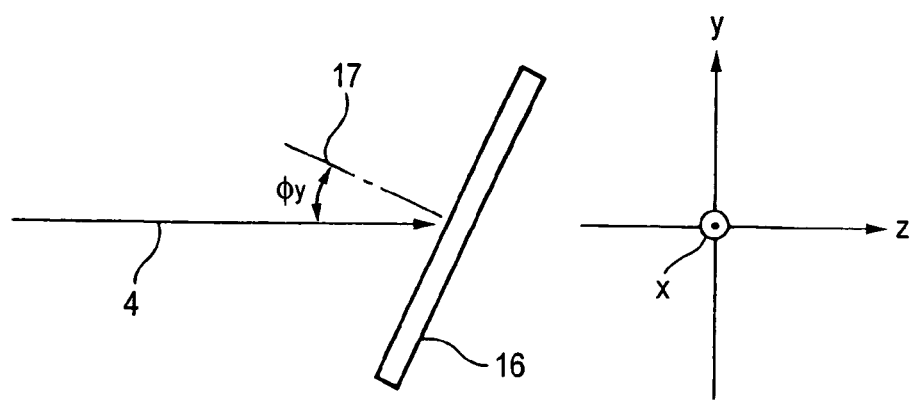
FIG. 10B is a diagram showing an example of an incidence angle of the ion beam on a target and shows an incidence angle $\Phi_y$ in y direction.
Figure 11:
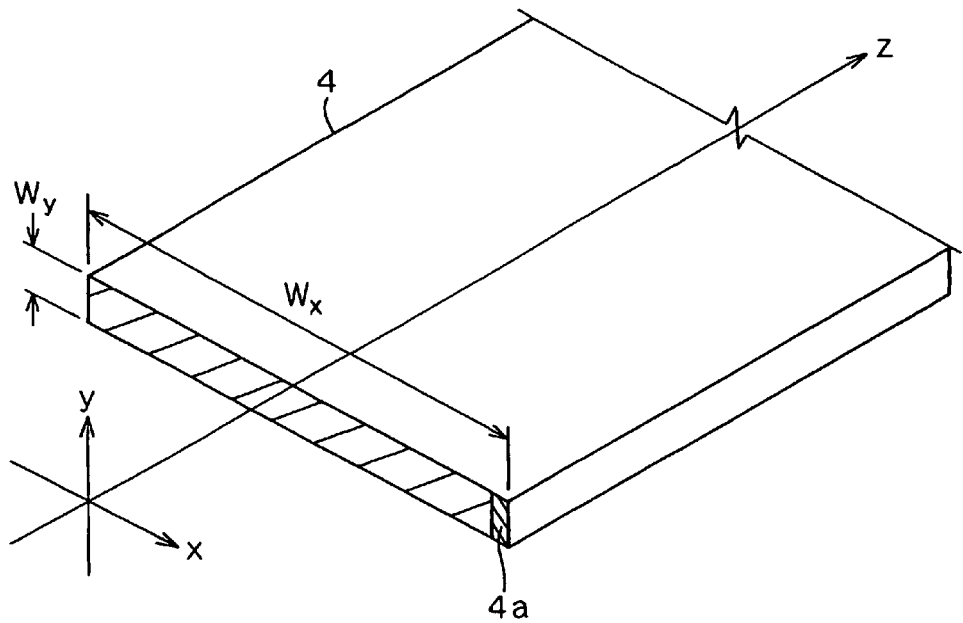
FIG. 11 is a schematic perspective view partially showing an example of an ion beam which, through scanning in x direction, has a ribbon-like shape where the size in x direction is larger than that in y direction that is substantially orthogonal to the x direction.
Figure 12:
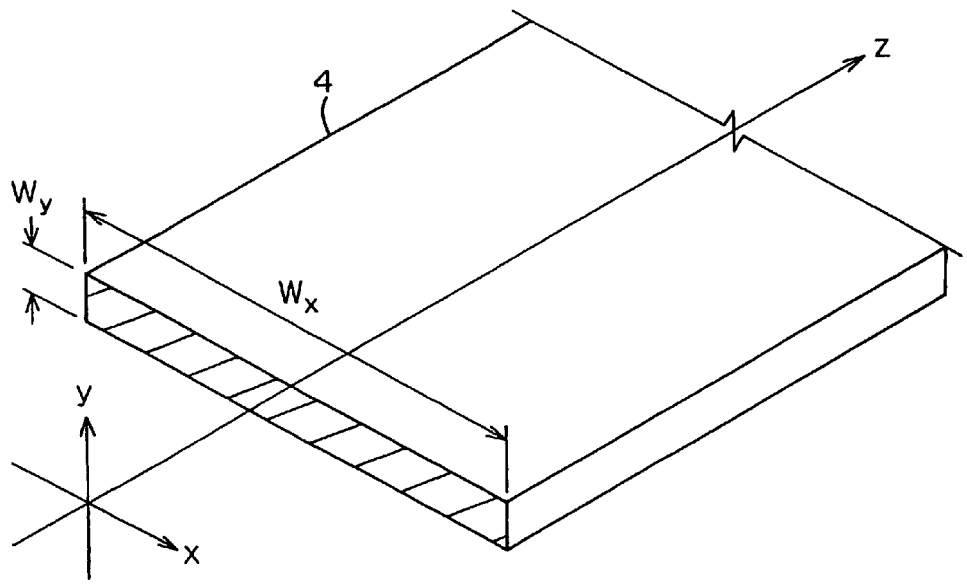
FIG. 12 is a schematic perspective view partially showing an example of an ion beam which, not through scanning in x direction, has a ribbon-like shape where the size in x direction is larger than that in y direction that is substantially orthogonal to the x direction.

Now, attention is paid to an i-th detector (for example, Faraday Cup) in x direction of the forestage mutlipoints Faraday 24 and an x coordinate position of the center is designated by notation $x_i$. At this occasion, a function representing the beam current density distribution $j_f$(y) in y direction at the x coordinate $x_i$ is defined as $j_{f,i}$ (y) at the position $z_f$ of the forestage beam restricting shutter 32. At this occasion, the beam current $S_{f,i}$ (y1) measured by the i-th detector is represented by Equation 4 shown below. FIG. 9 illustrates the beam current. In this case, the beam current density $j_{f,i}$ is set to null at $y_0$ or less.

$$S_{f,i}(y_1) = \int_{y_0}^{y_1} j_{f,i}(y) dy \qquad \text{[Equation 4]}$$

Therefore, the beam current density distribution $j_{f,i}(y)$ in y direction of the ion beam 4 at position $z_f$, $x_i$ can be calculated by measuring the beam current $S_{f,i}(y)$ by the forestage multipoints Faraday 24 while driving the forestage beam restricting shutter 32 in y direction by the forestage shutter driving apparatus 36 and from a change rate represented by the following equation. This is a step of measuring a forestage beam current density distribution and the step is executed.

$$dS_{f,i}(y)/dy = j_{f,i}(y) \qquad \text{[Equation 5]}$$

A beam current density distribution $j_{b,i}(y)$ in y direction of the ion beam 4 at position $z_b$, $x_i$ can be calculated by using the poststage multipoint Faraday 28, the poststage beam restricting shutter 42 and the poststage shutter driving apparatus 46 by a method similar to the above-described. This is a step of measuring a poststage beam current density distribution and the step is executed. Further, in measuring at the poststage, so as not to constitute a hindrance of the measurement, the forestage beam restricting shutter 32, the forestage multipoints Faraday 24 and the target 16 are placed outside of the path of the ion beam 4. The control may be executed by the control apparatus 50. In this case, the forestage mulipoints Faraday 24 may be placed outside of the path of the ion beam 4 by using a driving apparatus, not illustrated.

Further, from the beam current density distributions $j_{f,i}(y)$, $j_{b,i}(y)$ calculated as described above, center positions $y_{cf}$, $y_{cb}$ in y direction of the ion beam 4 at the respective positions $z_f$, $z_b$ of the forestage beam restricting shutter 32, the poststage beam restricting shutter 42 are respectively calculated. The definition of the center position in y direction of the ion beam 4 has previously been explained in reference to FIG. 4. This is a step of calculating a forestage center position and a step of calculating a poststage center position.

Further, by using the center positions $y_{cf}$, $y_{cb}$ calculated as described above and the distance L, based on Equation 1 or an equation mathematically equivalent thereto, the angle deviation $\theta_y$ in y direction of the ion beam 4 is calculated. This is a step of calculating an angle deviation. Thereby, a situation of the center trajectory in y direction of the ion beam 4 can be known.

Further, according to the embodiment, the control apparatus 50 can execute a processing of measuring the forestage beam current density distribution having a content the same as the step of measuring the forestage beam current density distribution, a processing of measuring a poststage beam current density distribution having a content the same as the step of measuring the forestage beam current density distribution, a processing of calculating a forestage center position having a content the same as the step of calculating the forestage center position, a processing of calculating a poststage center position having a content the same as the step of calculating the poststage center position and a processing an angle deviation having a content the same as the step of calculating the angle deviation.

Further, as needed, from the beam current density distributions $j_{f,i}(y)$, $j_{b,i}(y)$ calculated as described above, beam sizes $d_{yf}$, $d_{yb}$ in y direction of the ion beam 4 at the respective positions $z_f$, $z_b$ of the forestage beam restricting shutter 32, the poststage beam restricting shutter 42 are respectively calculated. The definition of the beam size in y direction of the ion beam 4 has previously been explained in reference to FIG. 5 and FIG. 6. This is a step of calculating a forestage beam size and a step of calculating a poststage beam size.

Further, as needed, by using the beam sizes $d_{yf}$, $d_{yb}$ calculated as described above and the distance L, based on Equation 2 or an equation mathematically equivalent thereto, the diverging angle $\alpha_{max}$ in y direction of the ion beam 4 is calculated. The definition of the diverging angle $\alpha_{max}$ has previously been explained in reference to FIG. 6. This is a step of calculating a diverging angle.

Further, as needed, by using the beam sizes $d_{yf}$, $d_{yb}$ calculated as described above, the distances L, $L_1$, and $L_2$, based on Equation 3 or an equation mathematically equivalent thereto, the beam size $d_{yt}$ in y direction of the ion beam 4 on the target 16 (also refer to FIG. 6) is calculated. This is a step of calculating a beam size.

Further, as needed, the control apparatus 50 may be made to execute a processing of calculating a forestage beam size having a content the same as the step of calculating the forestage beam size, a processing of calculating a poststage beam size having a content the same as the step of calculating the poststage beam size, a step of calculating a diverging angle having a content the same as the step of calculating the diverging angle and a processing of calculating a beam size having a content the same as the step of calculating the beam size, and according to the embodiment, the control apparatus 50 can also execute the processings.

Further, when the forestage multipoints Faraday 24 includes n pieces (n is an integer equal to or larger than 2) of detectors in x direction, the notation i designates an arbitrary number from 1 to n. The same goes with the poststage multipoints Faraday 28. Therefore, by using a detector of an arbitrary number in 1 through n in x direction, at the position of the detector, measurement similar to the above-described can be carried out. According to the configuration, also the x-direction distributions of the angle deviation $\theta_y$, the diverging angle $\alpha_{max}$, and the beam size $d_{yt}$ in y direction of the ion beam 4 can be measured. In the case of the ion beam 4 is formed into a ribbon-like shape not through scanning in x direction, particularly, the x-direction distributions of the angle deviation $\theta_y$, the diverging angle $\alpha_{max}$, and the beam size $d_{yt}$ in y direction of the ion beam 4 tend to be nonuniform, as compared with the case where the ion beam 4 is formed into a ribbon-like shape through scanning in x direction. Therefore, it is significant that the x-direction distributions of the values are measured and known. This is applicable also to embodiments described below.

In the forestage side, instead of disposing the forestage beam restricting shutter 32 and the forestage shutter driving apparatus which drives the shutter in y direction as in the above-described embodiment (the embodiment shown in FIG. 7 and the like, the same shall apply hereinafter), a mask 52 having an aperture 54 through which the ion beam 4 passes may be disposed in the vicinity of the upstream of the forestage multipoints Faraday 24, and the forestage multipoints Faraday 24 may be driven in y direction by a forestage Faraday driving apparatus 56 as in an embodiment shown in FIG. 13.

The embodiment shown in FIG. 13 will be described in detail. FIG. 13 corresponds to FIG. 8 described above.

The forestage multipoints Faraday 24 is configured so as to be driven in a rising direction indicated by the arrow 58 or a lowering direction opposite thereto, via a shaft 57 by the forestage Faraday driving apparatus 56, and inserted into and extracted from the path of the ion beam 4 as described above. The forestage multipoints Faraday 24 and the shaft 57 are electrically insulated from each other by an insulator (not shown) so as not to obstruct the beam current measurement of the forestage multipoints Faraday 24.

The measurement of the ion beam 4 in which the forestage multipoints Faraday 24 is used may be performed during a rising process of the forestage multipoints Faraday 24 or during a lowering process of the forestage multipoints Faraday 24. In this specification, an example in which the measurement is performed during the rising process as indicated by the arrow 58 will be described.

As described above (for example, see FIG. 7), the forestage multipoints Faraday 24 has inlets 26 which are in front of plural detectors. In the embodiment, a line connecting the upper ends 60 of the plural inlets 26 together is substantially parallel to the x direction. According to the configuration, the balance of the measurement in x direction is improved.

The forestage Faraday driving apparatus 56 has a position sensor (not shown) which precisely measures and outputs a position $y_1$ in y direction of the upper ends 60.

In the embodiment, instead of driving the forestage shutter driving apparatus 36 and taking in information of the position $y_1$ therefrom as in the above-described embodiment, the control apparatus 50 drives the forestage Faraday driving apparatus 56 as described above, and takes in information of the position $y_1$ therefrom.

In the embodiment, the position of the inlets 26 of the forestage multipoints Faraday 24 is indicated by $z_f$, the distance in the direction of z axis between the inlets 26 and the poststage beam restricting shutter 42, i.e., the distance between the positions $z_f$ and $z_b$, is indicated by L, and the distance between the inlets 26 and the target 16, i.e., the distance between the positions $z_f$ and $z_t$ is indicated by $L_1$. The distance $L_2$ is identical with the case of the above-described embodiment.

Information of the distances L, $L_1$, and $L_2$ is given to the control apparatus 50 (for example, the information is set). Alternatively, the information of the distance L may not be given, and the control apparatus 50 may perform a calculation of $L=L_1+L_2$.

In this example, the front shape of the aperture 54 of the mask 52 is a rectangular which extends in x direction. Preferably, the size $W_m$ in y direction of the aperture 54 is not larger than the size $W_f$ in y direction of the inlets 26 of the forestage multipoints Faraday 24 because the measurement is easily conducted. In the embodiment, $W_m < W_f$ is set. Following description will be made with placing emphasis on this example.

At first, it is assumed that the level of the upper ends 60 of the forestage multipoints Faraday 24 is lower than that of the aperture 54 of the mask 52. In this case, the ion beam 4 is blocked by the mask 52, and not incident at all on the forestage multipoints Faraday 24. The y-coordinate position of the upper ends 60 of the forestage multipoints Faraday 24 at this time is indicated by $y_0$.

Then, the forestage multipoints Faraday 24 is driven in y direction as indicated by the arrow 58. As the driving is further advanced, part of the ion beam 4 which has been blocked by the mask 52 gradually becomes incident on the forestage multipoints Faraday 24 with passing the aperture 54. The y-coordinate position of the upper ends 60 of the inlets 26 of the forestage multipoints Faraday 24 at the timing when at least part of the ion beam 4 is incident on the forestage multipoints Faraday 24 is indicated by $y_1$.

In the same manner as the above-described embodiment, attention is paid on an i-th detector (for example, a Faraday cup) in x direction of the forestage multipoints Faraday 24, the x-coordinate position of the center is indicated by $x_i$. At this time, the beam current density distribution $j_i(y)$ in y direction at the x coordinate xi and at the position $z_f$ of the inlets 26 of the forestage multipoints Faraday 24 is expressed by a function $j_{f,i}(y)$. In this case, the beam current $S_{f,i}(y_1)$ which is measured by the i-th detector is expressed by Equation 4 above. This is illustrated in the same manner as FIG. 9 above.

While the forestage multipoints Faraday 24 is driven in y direction by the forestage Faraday driving apparatus 56, therefore, the beam current $S_{f,i}(y)$ is measured by the forestage multipoints Faraday 24, and a change rate expressed by Equation 5 above is obtained, i.e., the beam current $S_{f,i}(y)$ is differentiated with respect to the distance y, whereby the beam current density distribution $j_{f,i}(y)$ in y direction of the ion beam 4 at the position $z_f$, $x_i$ can be obtained. This is the forestage beam current density distribution measuring step, and this step is performed.

Contrary to the above example, alternatively, the beam current density distribution $j_{f,i}(y)$ of the ion beam 4 may be obtained while the forestage multipoints Faraday 24 is lowered from the upper side. In the alternative, attention is paid on the lower ends 62 of the inlets 26 of the forestage multipoints Faraday 24 instead of the upper ends 60, and a line connecting the lower ends 62 of the plural inlets 26 together is substantially parallel to the x direction.

In the case where the size $W_m$ of the aperture 54 of the mask 52 is larger than the size $W_f$ of the inlets 26 of the forestage multipoints Faraday 24, there is a possibility that the increase and decrease of the beam current are cancelled each other in the middle of driving of the forestage multipoints Faraday 24. However, it is possible to avoid an influence of this. For example, the measurement may be performed with splitting the measurement into a measurement in which the forestage multipoints Faraday 24 is raised from the lower side to a position that is past the center in y direction of the ion beam 4, and that in which the forestage multipoints Faraday 24 is lowered from the upper side.

In the case where, at the position of the mask 52, the size $W_y$ in y direction of the ion beam 4 is smaller than the size $W_m$ of the aperture 54, the relationship between the size $W_f$ of the forestage multipoints Faraday 24 and the size $W_y$ instead of the size $W_m$ may be considered in the same manner as described above.

As seen from the combination of the descriptions of the above two paragraphs, the size $W_m$ of the aperture 54 of the mask 52 may be larger than the size $W_f$ of the inlets 26 of the forestage multipoints Faraday 24 and the size $W_y$ in y direction of the ion beam 4. In other words, the mask 52 is not necessarily disposed.

With using the thus obtained beam current density distribution $j_{f,i}(y)$, in the same manner as the above-described embodiment, the forestage center position calculating step of obtaining the center position $y_{cf}$ in the y direction of the ion beam 4, the angle deviation calculating step of obtaining the angle deviation $\theta_y$ in the y direction of the ion beam 4, the forestage beam size calculating step of obtaining the beam size $d_{yf}$ in the y direction of the ion beam 4 at the position of the inlets 26 of the forestage multipoints Faraday 24, the diverging angle calculating step of obtaining the diverging angle $\alpha_{max}$ in the y direction of the ion beam 4, and the beam size calculating step of obtaining the beam size $d_{yt}$ in the y direction of the ion beam 4 on the target 16 can be performed.

In the embodiment also, the control apparatus 50 can perform: a forestage beam current density distribution measuring process the contents of which are identical with those of the forestage beam current density distribution measuring step; a poststage beam current density distribution measuring process the contents of which are identical with those of the poststage beam current density distribution measuring step; a forestage center position calculating step the contents of which are identical with those of the forestage center position calculating step; a poststage center position calculating step the contents of which are identical with those of the poststage center position calculating step; and the angle deviation calculating process the contents of which are identical with those of the angle deviation calculating step. As required, furthermore, a forestage beam size calculating process the contents of which are identical with those of the forestage beam size calculating step, a poststage beam size calculating process the contents of which are identical with those of the poststage beam size calculating step, a diverging angle calculating process the contents of which are identical with those of the diverging angle calculating step, and a beam size calculating process the contents of which are identical with those of the beam size calculating step may be performed.

Also in the case of the above-described embodiment, the forestage Faraday driving apparatus 56 which inserts and extracts the forestage multipoints Faraday 24 into and from the path of the ion beam 4 is usually disposed. In the embodiment, the forestage Faraday driving apparatus 56 may be used also in the measurement of the ion beam 4, and the forestage shutter driving apparatus 36 may be omitted. Therefore, the configuration can be made more simplified than the case of the above-described embodiment.

Based on results of the thus performed measurements of the angle deviation $\theta_y$, the diverging angle $\alpha_{max}$, and the beam size $d_{yt}$ of the ion beam 4, it may be determined whether ion implantation can be performed on the target 16 or not. In this case, the measurements of the angle deviation $\theta_y$, the diverging angle $\alpha_{max}$, and the beam size $d_{yt}$ of the ion beam 4 may be performed before or after the ion implantation on the target 16. Usually, in order to previously know the state of the ion beam 4, it is preferable to perform the measurements before the ion implantation. Alternatively, the measurements may be performed after ion implantation, and a result of the ion implantation which is performed immediately before the measurements may be checked thereafter.

Based on results of the measurements of the angle deviation $\theta_y$, the diverging angle $\alpha_{max}$, and the beam size $d_{yt}$ of the ion beam 4, the ion beam 4 may be adjusted. For example, the ion source from which the ion beam 4 is emitted, and the scanner and the like which exist in the beam line of the ion beam 4 may be adjusted.

What is claimed is:

1. An ion beam measuring method to be performed in an ion implanting apparatus for, not through scanning in x direction, irradiating a target with an ion beam which has a ribbon-like shape where a size in x direction is larger than a size in y direction that is substantially orthogonal to the x direction, said ion implanting apparatus having a forestage multipoints Faraday and a poststage multipoints Faraday on upstream and downstream sides of said target, respectively, each of said forestage multipoints Faraday and said poststage multipoints Faraday being configured by juxtaposing in the x direction plural detectors which measure a beam current of the ion beam, said ion implanting apparatus further having a forestage beam restricting shutter which is disposed in a vicinity of an upstream of said forestage multipoints Faraday to block the ion beam, and which has a side that is substantially parallel to the x direction, a forestage shutter driving apparatus which drives said forestage beam restricting shutter in the y direction, a poststage beam restricting shutter which is disposed in a vicinity of an upstream of said poststage multipoints Faraday to block the ion beam, and which has a side that is substantially parallel to the x direction, and a poststage shutter driving apparatus which drives said poststage beam restricting shutter in the y direction, said ion beam measuring method comprising:

a forestage beam current density distribution measuring step of, while driving said forestage beam restricting shutter in the y direction by said forestage shutter driving apparatus, measuring a change of a beam current of the ion beam which passes an outside of the side of said forestage beam restricting shutter, and which is incident on said forestage multipoints Faraday, to obtain a beam current density distribution in the y direction of the ion beam at a position of said forestage beam restricting shutter;

a forestage center position calculating step of, from the beam current density distribution obtained in said forestage beam current density distribution measuring step, obtaining a center position $y_{cf}$ in the y direction of the ion beam at the position of said forestage beam restricting shutter;

a poststage beam current density distribution measuring step of, while driving said poststage beam restricting shutter in the y direction by said poststage shutter driving apparatus, measuring a change of a beam current of the ion beam which passes an outside of the side of said poststage beam restricting shutter, and which is incident on said poststage multipoints Faraday, to obtain a beam current density distribution in the y direction of the ion beam at a position of said poststage beam restricting shutter;

a poststage center position calculating step of, from the beam current density distribution obtained in said poststage beam current density distribution measuring step, obtaining a center position $y_{cb}$ in the y direction of the ion beam at the position of said poststage beam restricting shutter; and an angle deviation calculating step of, using the center position $y_{cf}$ obtained in said forestage center position calculating step, the center position $y_{cb}$ obtained in said poststage center position calculating step, and a distance L between said forestage beam restricting shutter and said poststage beam restricting shutter, obtaining an angle deviation $\theta_y$ in the y direction of the ion beam, based on a following equation or an equation which is mathematically equivalent to the equation:

$$\theta_y = \tan^{-1}\{(y_{cb} - y_{cf})/L\}.$$

2. An ion beam measuring method to be performed in an ion implanting apparatus for, not through scanning in x direction, irradiating a target with an ion beam which has a ribbon-like shape where a size in x direction is larger than a size in y direction that is substantially orthogonal to the x direction, said ion implanting apparatus having a forestage multipoints Faraday and a poststage multipoints Faraday on upstream and downstream sides of said target, respectively, each of said forestage multipoints Faraday and said poststage multipoints Faraday being configured by juxtaposing in the x direction plural detectors which measure a beam current of the ion beam, said ion implanting apparatus further having a forestage beam restricting shutter which is disposed in a vicinity of an upstream of said forestage multipoints Faraday to block the ion beam, and which has a side that is substantially parallel to the x direction, a forestage shutter driving apparatus which drives said forestage beam restricting shutter in the y direction, a poststage beam restricting shutter which is disposed in a vicinity of an upstream of said poststage multipoints Faraday to block the ion beam, and which has a side that is substantially parallel to the x direction, and a poststage shutter driving apparatus which drives said poststage beam restricting shutter in the y direction, said ion beam measuring method comprising:

a forestage beam current density distribution measuring step of, while driving said forestage beam restricting shutter in the y direction by said forestage shutter driving apparatus, measuring a change of a beam current of the ion beam which passes an outside of the side of said forestage beam restricting shutter, and which is incident on said forestage multipoints Faraday, to obtain a beam current density distribution in the y direction of the ion beam at a position of said forestage beam restricting shutter;

a forestage beam size calculating step of, from the beam current density distribution obtained in said forestage beam current density distribution measuring step, obtaining a beam size $d_{yf}$ in the y direction of the ion beam at the position of said forestage beam restricting shutter;

a poststage beam current density distribution measuring step of, while driving said poststage beam restricting shutter in the y direction by said poststage shutter driving apparatus, measuring a change of a beam current of the ion beam which passes an outside of the side of said poststage beam restricting shutter, and which is incident on said poststage multipoints Faraday, to obtain a beam current density distribution in the y direction of the ion beam at a position of said poststage beam restricting shutter;

a poststage beam size calculating step of, from the beam current density distribution obtained in said poststage beam current density distribution measuring step, obtaining a beam size $d_{yb}$ in the y direction of the ion beam at the position of said poststage beam restricting shutter; and a diverging angle calculating step of, using the beam size $d_{yf}$ obtained in said forestage beam size calculating step, the beam size $d_{yb}$ obtained in said poststage beam size calculating step, and a distance L between said forestage beam restricting shutter and said poststage beam restricting shutter, obtaining a diverging angle $\alpha_{max}$ in the y direction of the ion beam, based on a following equation or an equation which is mathematically equivalent to the equation:

$$\alpha_{max}=\tan^{-1}\{(d_{yb}-d_{yf})/2L\}.$$

3. An ion beam measuring method to be performed in an ion implanting apparatus for, not through scanning in x direction, irradiating a target with an ion beam which has a ribbon-like shape where a size in x direction is larger than a size in y direction that is substantially orthogonal to the x direction, said ion implanting apparatus having a forestage multipoints Faraday and a poststage multipoints Faraday on upstream and downstream sides of said target, respectively, each of said forestage multipoints Faraday and said poststage multipoints Faraday being configured by juxtaposing in the x direction plural detectors which measure a beam current of the ion beam, said ion implanting apparatus further having a forestage beam restricting shutter which is disposed in a vicinity of an upstream of said forestage multipoints Faraday to block the ion beam, and which has a side that is substantially parallel to the x direction, a forestage shutter driving apparatus which drives said forestage beam restricting shutter in the y direction, a poststage beam restricting shutter which is disposed in a vicinity of an upstream of said poststage multipoints Faraday to block the ion beam, and which has a side that is substantially parallel to the x direction, and a poststage shutter driving apparatus which drives said poststage beam restricting shutter in the y direction, said ion beam measuring method comprising:

a forestage beam current density distribution measuring step of, while driving said forestage beam restricting shutter in the y direction by said forestage shutter driving apparatus, measuring a change of a beam current of the ion beam which passes an outside of the side of said forestage beam restricting shutter, and which is incident on said forestage multipoints Faraday, to obtain a beam current density distribution in the y direction of the ion beam at a position of said forestage beam restricting shutter;

a forestage beam size calculating step of, from the beam current density distribution obtained in said forestage beam current density distribution measuring step, obtaining a beam size $d_{yf}$ in the y direction of the ion beam at the position of said forestage beam restricting shutter;

a poststage beam current density distribution measuring step of, while driving said poststage beam restricting shutter in the y direction by said poststage shutter driving apparatus, measuring a change of a beam current of the ion beam which passes an outside of the side of said poststage beam restricting shutter, and which is incident on said poststage multipoints Faraday, to obtain a beam current density distribution in the y direction of the ion beam at a position of said poststage beam restricting shutter;

a poststage beam size calculating step of, from the beam current density distribution obtained in said poststage beam current density distribution measuring step, obtaining a beam size $d_{yb}$ in the y direction of the ion beam at the position of said poststage beam restricting shutter; and a beam size calculating step of, from the beam size $d_{yf}$ obtained in said forestage beam size calculating step, the beam size $d_{yb}$ obtained in said poststage beam size calculating step, a distance L between said forestage beam restricting shutter and said poststage beam restricting shutter, a distance $L_1$ between said forestage beam-restricting shutter and said target, and a distance $L_2$ between said target and said poststage beam restricting shutter, obtaining a beam size $d_{yt}$ in the y direction of the ion beam on said target, based on a following equation or an equation which is mathematically equivalent to the equation:

$$d_{yt}=(L_2/L)d_{yf}+(L_1/L)d_{yb} \text{ (where } L=L_1+L_2\text{)}.$$

4. An ion beam measuring method according to claim 1, further comprising:

a forestage beam size calculating step of, from the beam current density distribution obtained in said forestage beam current density distribution measuring step, obtaining a beam size $d_{yf}$ in the y direction of the ion beam at the position of said forestage beam restricting shutter;

a poststage beam size calculating step of, from the beam current density distribution obtained in said poststage beam current density distribution measuring step, obtaining a beam size $d_{yb}$ in the y direction of the ion beam at the position of said poststage beam restricting shutter; and a diverging angle calculating step of, using the beam size $d_{yf}$ obtained in said forestage beam size calculating step, the beam size $d_{yb}$ obtained in said poststage beam size calculating step, and a distance L between said forestage beam restricting shutter and said poststage beam restricting shutter, obtaining a diverging angle $\alpha_{max}$ in the y direction of the ion beam, based on a following equation or an equation which is mathematically equivalent to the equation:

$$\alpha_{max} = \tan^{-1}\{(d_{yb} - d_{yf})/2L\}.$$

5. An ion beam measuring method according to claim 4, further comprising:
a beam size calculating step of, from the beam size $d_{yf}$ obtained in said forestage beam size calculating step, the beam size $d_{yb}$ obtained in said poststage beam size calculating step, the distance L between said forestage beam restricting shutter and said poststage beam restricting shutter, a distance $L_1$ between said forestage beam restricting shutter and said target, and a distance $L_2$ between said target and said poststage beam restricting shutter, obtaining a beam size $d_{yt}$ in the y direction of the ion beam on said target, based on a following equation or an equation which is mathematically equivalent to the equation:

$$d_{yt} = (L_2/L)d_{yf} + (L_1/L)d_{yb} \text{ (where } L = L_1 + L_2).$$

6. An ion implanting apparatus for, not through scanning in x direction, irradiating a target with an ion beam which has a ribbon-like shape where a size in x direction is larger than a size in y direction that is substantially orthogonal to the x direction, said ion implanting apparatus comprising:
a forestage multipoints Faraday and a poststage multipoints Faraday on upstream and downstream sides of said target, respectively, each of said forestage multipoints Faraday and said poststage multipoints Faraday being configured by juxtaposing in the x direction plural detectors which measure a beam current of the ion beam;
a forestage beam restricting shutter which is disposed in a vicinity of an upstream of said forestage multipoints Faraday to block the ion beam, and which has a side that is substantially parallel to the x direction;
a forestage shutter driving apparatus which drives said forestage beam restricting shutter in the y direction;
a poststage beam restricting shutter which is disposed in a vicinity of an upstream of said poststage multipoints Faraday to block the ion beam, and which has a side that is substantially parallel to the x direction;
a poststage shutter driving apparatus which drives said poststage beam restricting shutter in the y direction; and
a control apparatus which performs: (a) a forestage beam current density distribution measuring process of, while driving said forestage beam restricting shutter in the y direction by said forestage shutter driving apparatus, measuring a change of a beam current of the ion beam which passes an outside of the side of said forestage beam restricting shutter, and which is incident on said forestage multipoints Faraday, to obtain a beam current density distribution in the y direction of the ion beam at a position of said forestage beam restricting shutter; (b) a forestage center position calculating process of, from the beam current density distribution obtained in said forestage beam current density distribution measuring process, obtaining a center position $y_{cf}$ in the y direction of the ion beam at the position of said forestage beam restricting shutter; (c) a poststage beam current density distribution measuring process of, while driving said poststage beam restricting shutter in the y direction by said poststage shutter driving apparatus, measuring a change of a beam current of the ion beam which passes an outside of the side of said poststage beam restricting shutter, and which is incident on said poststage multipoints Faraday, to obtain a beam current density distribution in the y direction of the ion beam at a position of said poststage beam restricting shutter; (d) a poststage center position calculating process of, from the beam current density distribution obtained in said poststage beam current density distribution measuring process, obtaining a center position $y_{cb}$ in the y direction of the ion beam at the position of said poststage beam restricting shutter; and (e) an angle deviation calculating process of, using the center position $y_{cf}$ obtained in said forestage center position calculating process, the center position $y_{cb}$ obtained in said poststage center position calculating process, and a distance L between said forestage beam restricting shutter and said poststage beam restricting shutter, obtaining an angle deviation $\theta_y$ in the y direction of the ion beam, based on a following equation or an equation which is mathematically equivalent to the equation:

$$\theta_y = \tan^{-1}\{(y_{cb} - y_{cf})/L\}.$$

7. An ion implanting apparatus for, not through scanning in x direction, irradiating a target with an ion beam which has a ribbon-like shape where a size in x direction is larger than a size in y direction that is substantially orthogonal to the x direction, said ion implanting apparatus comprising:
a forestage multipoints Faraday and a poststage multipoints Faraday on upstream and downstream sides of said target, respectively, each of said forestage multipoints Faraday and said poststage multipoints Faraday being configured by juxtaposing in the x direction plural detectors which measure a beam current of the ion beam;
a forestage beam restricting shutter which is disposed in a vicinity of an upstream of said forestage multipoints Faraday to block the ion beam, and which has a side that is substantially parallel to the x direction;
a forestage shutter driving apparatus which drives said forestage beam restricting shutter in the y direction;
a poststage beam restricting shutter which is disposed in a vicinity of an upstream of said poststage multipoints Faraday to block the ion beam, and which has a side that is substantially parallel to the x direction;
a poststage shutter driving apparatus which drives said poststage beam restricting shutter in the y direction; and
a control apparatus which performs: (a) a forestage beam current density distribution measuring process of, while driving said forestage beam restricting shutter in the y direction by said forestage shutter driving apparatus, measuring a change of a beam current of the ion beam which passes an outside of the side of said forestage beam restricting shutter, and which is incident on said forestage multipoints Faraday, to obtain a beam current density distribution in the y direction of the ion beam at a position of said forestage beam restricting shutter; (b) a forestage beam size calculating process of, from the beam current density distribution obtained in said forestage beam current density distribution measuring process, obtaining a beam size $d_{yf}$ in the y direction of the ion beam at the position of said forestage beam restricting shutter; (c) a poststage beam current density distribution measuring process of, while driving said poststage beam restricting shutter in the y direction by said poststage shutter driving apparatus, measuring a change of a beam current of the ion beam which passes an outside of the side of said poststage beam restricting shutter, and which is incident on said poststage multipoints Faraday, to obtain a beam current density distribution in the y direction of the ion beam at a position of said poststage beam restricting shutter; (d) a poststage beam size calculating process of, from the beam current density distribution obtained in said poststage beam current density distribution measuring process, obtaining a beam size $d_{yb}$ in the y direction of the ion beam at the position of said poststage beam restricting shutter; and (e) a diverging angle calculating process of, using the beam size $d_{yf}$ obtained in said forestage beam size calculating process, the beam size $d_{yb}$ obtained in said poststage beam size calculating process, and a distance L between said forestage beam restricting shutter and said poststage beam restricting shutter, obtaining a diverging angle $\alpha_{max}$ in the y direction of the ion beam, based on a following equation or an equation which is mathematically equivalent to the equation:

$$\alpha_{max} = \tan^{-1}\{(d_{yb} - d_{yf})/2L\}.$$

8. An ion implanting apparatus for, not through scanning in x direction, irradiating a target with an ion beam which has a ribbon-like shape where a size in x direction is larger than a size in y direction that is substantially orthogonal to the x direction, said ion implanting apparatus comprising:
  a forestage multipoints Faraday and a poststage multipoints Faraday on upstream and downstream sides of said target, respectively, each of said forestage multipoints Faraday and said poststage multipoints Faraday being configured by juxtaposing in the x direction plural detectors which measure a beam current of the ion beam;
  a forestage beam restricting shutter which is disposed in a vicinity of an upstream of said forestage multipoints Faraday to block the ion beam, and which has a side that is substantially parallel to the x direction;
  a forestage shutter driving apparatus which drives said forestage beam restricting shutter in the y direction;
  a poststage beam restricting shutter which is disposed in a vicinity of an upstream of said poststage multipoints Faraday to block the ion beam, and which has a side that is substantially parallel to the x direction;
  a poststage shutter driving apparatus which drives said poststage beam restricting shutter in the y direction; and
  a control apparatus which performs: (a) a forestage beam current density distribution measuring process of, while driving said forestage beam restricting shutter in the y direction by said forestage shutter driving apparatus, measuring a change of a beam current of the ion beam which passes an outside of the side of said forestage beam restricting shutter, and which is incident on said forestage multipoints Faraday, to obtain a beam current density distribution in the y direction of the ion beam at a position of said forestage beam restricting shutter; (b) a forestage beam size calculating process of, from the beam current density distribution obtained in said forestage beam current density distribution measuring process, obtaining a beam size $d_{yf}$ in the y direction of the ion beam at the position of said forestage beam restricting shutter; (c) a poststage beam current density distribution measuring process of, while driving said poststage beam restricting shutter in the y direction by said poststage shutter driving apparatus, measuring a change of a beam current of the ion beam which passes an outside of the side of said poststage beam restricting shutter, and which is incident on said poststage multipoints Faraday, to obtain a beam current density distribution in the y direction of the ion beam at a position of said poststage beam restricting shutter; (d) a poststage beam size calculating process of, from the beam current density distribution obtained in said poststage beam current density distribution measuring process, obtaining a beam size $d_{yb}$ in the y direction of the ion beam at the position of said poststage beam restricting shutter; and (e) a beam size calculating process of, from the beam size $d_{yf}$ obtained in said forestage beam size calculating process, the beam size $d_{yb}$ obtained in said poststage beam size calculating process, a distance L between said forestage beam restricting shutter and said poststage beam restricting shutter, a distance $L_1$ between said forestage beam restricting shutter and said target, and a distance $L_2$ between said target and said poststage beam restricting shutter, obtaining a beam size $d_{yt}$ in the y direction of the ion beam on said target, based on a following equation or an equation which is mathematically equivalent to the equation:

$$d_{yt} = (L_2/L)d_{yf} + (L_1/L)d_{yb} \text{ (where } L=L_1+L_2\text{)}.$$

9. An ion implanting apparatus according to claim 6, wherein said control apparatus further performs: (f) a forestage beam size calculating process of, from the beam current density distribution obtained in said forestage beam current density distribution measuring process, obtaining a beam size $d_{yf}$ in the y direction of the ion beam at the position of said forestage beam restricting shutter; (g) a poststage beam size calculating process of, from the beam current density distribution obtained in said poststage beam current density distribution measuring process, obtaining a beam size $d_{yb}$ in the y direction of the ion beam at the position of said poststage beam restricting shutter; and (h) a diverging angle calculating process of, using the beam size $d_{yf}$ obtained in said forestage beam size calculating process, the beam size $d_{yb}$ obtained in said poststage beam size calculating process, and a distance L between said forestage beam restricting shutter and said poststage beam restricting shutter, obtaining a diverging angle $\alpha_{max}$ in the y direction of the ion beam, based on a following equation or an equation which is mathematically equivalent to the equation:

$$\alpha_{max} = \tan^{-1}\{(d_{yb} - d_{yf})/2L\}.$$

10. An ion implanting apparatus according to claim 9, wherein said control apparatus further performs: (i) a beam size calculating process of, from the beam size $d_{yf}$ obtained in said forestage beam size calculating process, the beam size $d_{yb}$ obtained in said poststage beam size calculating process, the distance L between said forestage beam restricting shutter and said poststage beam restricting shutter, a distance $L_1$ between said forestage beam restricting shutter and said target, and a distance $L_2$ between said target and said poststage beam restricting shutter, obtaining a beam size $d_{yt}$ in the y direction of the ion beam on said target, based on a following equation or an equation which is mathematically equivalent to the equation:

$$d_{yt} = (L_2/L)d_{yf} + (L_1/L)d_{yb} \text{ (where } L=L_1+L_2\text{)}.$$

11. An ion beam measuring method to be performed in an ion implanting apparatus for, through scanning in x direction, or not through scanning in x direction, irradiating a target with an ion beam which has a ribbon-like shape where a size in x direction is larger than a size in y direction that is substantially orthogonal to the x direction, said ion implanting apparatus having a forestage multipoints Faraday and a poststage multipoints Faraday on upstream and downstream sides of said target, respectively, each of said forestage multipoints Faraday and said poststage multipoints Faraday being configured by juxtaposing in the x direction plural detectors which measure a beam current of the ion beam, and at least one of lines respectively connecting together upper ends and lower ends of plural inlets of said forestage multipoints Faraday is substantially parallel to the x direction, said ion implanting apparatus further having a mask which is disposed in a vicinity of an upstream of said forestage multipoints Faraday, and which has an aperture through which the ion beam passes, a forestage Faraday driving apparatus which drives said forestage multipoints Faraday in the y direction, a poststage beam restricting shutter which is disposed in a vicinity of an upstream of said poststage multipoints Faraday to block the ion beam, and which has a side that is substantially parallel to the x direction, and a poststage shutter driving apparatus which drives said poststage beam restricting shutter in the y direction, said ion beam measuring method comprising:

- a forestage beam current density distribution measuring step of, while driving said forestage multipoints Faraday in the y direction by said forestage Faraday driving apparatus, measuring a change of a beam current of the ion beam which passes said aperture of said mask, and which is incident on said forestage multipoints Faraday, to obtain a beam current density distribution in the y direction of the ion beam at a position of said inlets of said forestage multipoints Faraday;
- a forestage center position calculating step of, from the beam current density distribution obtained in said forestage beam current density distribution measuring step, obtaining a center position $y_{cf}$ in the y direction of the ion beam at the position of said inlets of said forestage multipoints Faraday;
- a poststage beam current density distribution measuring step of, while driving said poststage beam restricting shutter in the y direction by said poststage shutter driving apparatus, measuring a change of a beam current of the ion beam which passes an outside of the side of said poststage beam restricting shutter, and which is incident on said poststage multipoints Faraday, to obtain a beam current density distribution in the y direction of the ion beam at a position of said poststage beam restricting shutter;
- a poststage center position calculating step of, from the beam current density distribution obtained in said poststage beam current density distribution measuring step, obtaining a center position $y_{cb}$ in the y direction of the ion beam at the position of said poststage beam restricting shutter; and
- an angle deviation calculating step of, using the center position $y_{cf}$ obtained in said forestage center position calculating step, the center position $y_{cb}$ obtained in said poststage center position calculating step, and a distance L between said inlets of said forestage multipoints Faraday and said poststage beam restricting shutter, obtaining an angle deviation $\theta_y$ in the y direction of the ion beam, based on a following equation or an equation which is mathematically equivalent to the equation:

$$\theta_y = \tan^{-1}\{(y_{cb} - y_{cf})/L\}.$$

12. An ion beam measuring method to be performed in an ion implanting apparatus for, through scanning in x direction, or not through scanning in x direction, irradiating a target with an ion beam which has a ribbon-like shape where a size in x direction is larger than a size in y direction that is substantially orthogonal to the x direction, said ion implanting apparatus having a forestage multipoints Faraday and a poststage multipoints Faraday on upstream and downstream sides of said target, respectively, each of said forestage multipoints Faraday and said poststage multipoints Faraday being configured by juxtaposing in the x direction plural detectors which measure a beam current of the ion beam, and at least one of lines respectively connecting together upper ends and lower ends of plural inlets of said forestage multipoints Faraday is substantially parallel to the x direction, said ion implanting apparatus further having a mask which is disposed in a vicinity of an upstream of said forestage multipoints Faraday, and which has an aperture through which the ion beam passes, a forestage Faraday driving apparatus which drives said forestage multipoints Faraday in the y direction, a poststage beam restricting shutter which is disposed in a vicinity of an upstream of said poststage multipoints Faraday to block the ion beam, and which has a side that is substantially parallel to the x direction, and a poststage shutter driving apparatus which drives said poststage beam restricting shutter in the y direction, said ion beam measuring method comprising:

- a forestage beam current density distribution measuring step of, while driving said forestage multipoints Faraday in the y direction by said forestage Faraday driving apparatus, measuring a change of a beam current of the ion beam which passes said aperture of said mask, and which is incident on said forestage multipoints Faraday, to obtain a beam current density distribution in the y direction of the ion beam at a position of said inlets of said forestage multipoints Faraday;
- a forestage beam size calculating step of, from the beam current density distribution obtained in said forestage beam current density distribution measuring step, obtaining a beam size $d_{yf}$ in the y direction of the ion beam at the position of said inlets of said forestage multipoints Faraday;
- a poststage beam current density distribution measuring step of, while driving said poststage beam restricting shutter in the y direction by said poststage shutter driving apparatus, measuring a change of a beam current of the ion beam which passes an outside of the side of said poststage beam restricting shutter, and which is incident on said poststage multipoints Faraday, to obtain a beam current density distribution in the y direction of the ion beam at a position of said poststage beam restricting shutter;
- a poststage beam size calculating step of, from the beam current density distribution obtained in said poststage beam current density distribution measuring step, obtaining a beam size $d_{yb}$ in the y direction of the ion beam at the position of said poststage beam restricting shutter; and
- a diverging angle calculating step of, using the beam size $d_{yf}$ obtained in said forestage beam size calculating step, the beam size $d_{yb}$ obtained in said poststage beam size calculating step, and a distance L between said inlets of said forestage multipoints Faraday and said poststage beam restricting shutter, obtaining a diverging angle $\alpha_{max}$ in the y direction of the ion beam, based on a following equation or an equation which is mathematically equivalent to the equation:

$$\alpha_{max} = \tan^{-1}\{(d_{yb} - d_{yf})/2L\}.$$

13. An ion beam measuring method to be performed in an ion implanting apparatus for, through scanning in x direction, or not through scanning in x direction, irradiating a target with an ion beam which has a ribbon-like shape where a size in x direction is larger than a size in y direction that is substantially orthogonal to the x direction, said ion implanting apparatus having a forestage multipoints Faraday and a poststage multipoints Faraday on upstream and downstream sides of said target, respectively, each of said forestage multipoints Faraday and said poststage multipoints Faraday being configured by juxtaposing in the x direction plural detectors which measure a beam current of the ion beam, and at least one of lines respectively connecting together upper ends and lower ends of plural inlets of said forestage multipoints Faraday is substantially parallel to the x direction, said ion implanting apparatus further having a mask which is disposed in a vicinity of an upstream of said forestage multipoints Faraday, and which has an aperture through which the ion beam passes, a forestage Faraday driving apparatus which drives said forestage multipoints Faraday in the y direction, a poststage beam restricting shutter which is disposed in a vicinity of an upstream of said poststage multipoints Faraday to block the ion beam, and which has a side that is substantially parallel to the x direction, and a poststage shutter driving apparatus which drives said poststage beam restricting shutter in the y direction, said ion beam measuring method comprising:

- a forestage beam current density distribution measuring step of, while driving said forestage multipoints Faraday in the y direction by said forestage Faraday driving apparatus, measuring a change of a beam current of the ion beam which passes said aperture of said mask, and which is incident on said forestage multipoints Faraday, to obtain a beam current density distribution in the y direction of the ion beam at a position of said inlets of said forestage multipoints Faraday;
- a forestage beam size calculating step of, from the beam current density distribution obtained in said forestage beam current density distribution measuring step, obtaining a beam size $d_{yf}$ in the y direction of the ion beam at the position of said inlets of said forestage multipoints Faraday;
- a poststage beam current density distribution measuring step of, while driving said poststage beam restricting shutter in the y direction by said poststage shutter driving apparatus, measuring a change of a beam current of the ion beam which passes an outside of the side of said poststage beam restricting shutter, and which is incident on said poststage multipoints Faraday, to obtain a beam current density distribution in the y direction of the ion beam at a position of said poststage beam restricting shutter;
- a poststage beam size calculating step of, from the beam current density distribution obtained in said poststage beam current density distribution measuring step, obtaining a beam size $d_{yb}$ in the y direction of the ion beam at the position of said poststage beam restricting shutter; and
- a beam size calculating step of, from the beam size $d_{yf}$ obtained in said forestage beam size calculating step, the beam size $d_{yb}$ obtained in said poststage beam size calculating step, a distance L between said inlets of said forestage multipoints Faraday and said poststage beam restricting shutter, a distance $L_1$ between said inlets of said forestage multipoints Faraday and said target, and a distance $L_2$ between said target and said poststage beam restricting shutter, obtaining a beam size $d_{yt}$ in the y direction of the ion beam on said target, based on a following equation or an equation which is mathematically equivalent to the equation:

$$d_{yt}=(L_2/L)d_{yf}+(L_1/L)d_{yb} \text{ (where } L=L_1+L_2\text{)}.$$

14. An ion beam measuring method to be performed in an ion implanting apparatus for, through scanning in x direction, or not through scanning in x direction, irradiating a target with an ion beam which has a ribbon-like shape where a size in x direction is larger than a size in y direction that is substantially orthogonal to the x direction, said ion implanting apparatus having a forestage multipoints Faraday and a poststage multipoints Faraday on upstream and downstream sides of said target, respectively, each of said forestage multipoints Faraday and said poststage multipoints Faraday being configured by juxtaposing in the x direction plural detectors which measure a beam current of the ion beam, and at least one of lines respectively connecting together upper ends and lower ends of plural inlets of said forestage multipoints Faraday is substantially parallel to the x direction, said ion implanting apparatus further having a forestage Faraday driving apparatus which drives said forestage multipoints Faraday in the y direction, a poststage beam restricting shutter which is disposed in a vicinity of an upstream of said poststage multipoints Faraday to block the ion beam, and which has a side that is substantially parallel to the x direction, and a poststage shutter driving apparatus which drives said poststage beam restricting shutter in the y direction, said ion beam measuring method comprising:

- a forestage beam current density distribution measuring step of, while driving said forestage multipoints Faraday in the y direction by said forestage Faraday driving apparatus, measuring a change of a beam current of the ion beam which is incident on said forestage multipoints Faraday, to obtain a beam current density distribution in the y direction of the ion beam at a position of said inlets of said forestage multipoints Faraday;
- a forestage center position calculating step of, from the beam current density distribution obtained in said forestage beam current density distribution measuring step, obtaining a center position $y_{cf}$ in the y direction of the ion beam at the position of said inlets of said forestage multipoints Faraday;
- a poststage beam current density distribution measuring step of, while driving said poststage beam restricting shutter in the y direction by said poststage shutter driving apparatus, measuring a change of a beam current of the ion beam which passes an outside of the side of said poststage beam restricting shutter, and which is incident on said poststage multipoints Faraday, to obtain a beam current density distribution in the y direction of the ion beam at a position of said poststage beam restricting shutter;
- a poststage center position calculating step of, from the beam current density distribution obtained in said poststage beam current density distribution measuring step, obtaining a center position $y_{cb}$ in the y direction of the ion beam at the position of said poststage beam restricting shutter; and
- an angle deviation calculating step of, using the center position $y_{cf}$ obtained in said forestage center position calculating step, the center position $y_{cb}$ obtained in said poststage center position calculating step, and a distance L between said inlets of said forestage multipoints Faraday and said poststage beam restricting shutter, obtaining an angle deviation $\theta_y$ in the y direction of the ion beam, based on a following equation or an equation which is mathematically equivalent to the equation:

$$\theta_y=\tan^{-1}\{(y_{cb}-y_{cf})/L\}.$$

15. An ion beam measuring method to be performed in an ion implanting apparatus for, through scanning in x direction, or not through scanning in x direction, irradiating a target with an ion beam which has a ribbon-like shape where a size in x direction is larger than a size in y direction that is substantially orthogonal to the x direction, said ion implanting apparatus having a forestage multipoints Faraday and a poststage multipoints Faraday on upstream and downstream sides of said target, respectively, each of said forestage multipoints Faraday and said poststage multipoints Faraday being configured by juxtaposing in the x direction plural detectors which measure a beam current of the ion beam, and at least one of lines respectively connecting together upper ends and lower ends of plural inlets of said forestage multipoints Faraday is substantially parallel to the x direction, said ion implanting apparatus further having a forestage Faraday driving apparatus which drives said forestage multipoints Faraday in the y direction, a poststage beam restricting shutter which is disposed in a vicinity of an upstream of said poststage multipoints Faraday to block the ion beam, and which has a side that is substantially parallel to the x direction, and a poststage shutter driving apparatus which drives said poststage beam restricting shutter in the y direction, said ion beam measuring method comprising:

- a forestage beam current density distribution measuring step of, while driving said forestage multipoints Faraday in the y direction by said forestage Faraday driving apparatus, measuring a change of a beam current of the ion beam which is incident on said forestage multipoints Faraday, to obtain a beam current density distribution in the y direction of the ion beam at a position of said inlets of said forestage multipoints Faraday;
- a forestage beam size calculating step of, from the beam current density distribution obtained in said forestage beam current density distribution measuring step, obtaining a beam size $d_{yf}$ in the y direction of the ion beam at the position of said inlets of said forestage multipoints Faraday;
- a poststage beam current density distribution measuring step of, while driving said poststage beam restricting shutter in the y direction by said poststage shutter driving apparatus, measuring a change of a beam current of the ion beam which passes an outside of the side of said poststage beam restricting shutter, and which is incident on said poststage multipoints Faraday, to obtain a beam current density distribution in the y direction of the ion beam at a position of said poststage beam restricting shutter;
- a poststage beam size calculating step of, from the beam current density distribution obtained in said poststage beam current density distribution measuring step, obtaining a beam size $d_{yb}$ in the y direction of the ion beam at the position of said poststage beam restricting shutter; and
- a diverging angle calculating step of, using the beam size $d_{yf}$ obtained in said forestage beam size calculating step, the beam size $d_{yb}$ obtained in said poststage beam size calculating step, and a distance L between said inlets of said forestage multipoints Faraday and said poststage beam restricting shutter, obtaining a diverging angle $\alpha_{max}$ in the y direction of the ion beam, based on a following equation or an equation which is mathematically equivalent to the equation:

$$\alpha_{max} \tan^{-1}\{(d_{yb}-d_{yf})/2L\}.$$

16. An ion beam measuring method to be performed in an ion implanting apparatus for, through scanning in x direction, or not through scanning in x direction, irradiating a target with an ion beam which has a ribbon-like shape where a size in x direction is larger than a size in y direction that is substantially orthogonal to the x direction, said ion implanting apparatus having a forestage multipoints Faraday and a poststage multipoints Faraday on upstream and downstream sides of said target, respectively, each of said forestage multipoints Faraday and said poststage multipoints Faraday being configured by juxtaposing in the x direction plural detectors which measure a beam current of the ion beam, and at least one of lines respectively connecting together upper ends and lower ends of plural inlets of said forestage multipoints Faraday is substantially parallel to the x direction, said ion implanting apparatus further having a forestage Faraday driving apparatus which drives said forestage multipoints Faraday in the y direction, a poststage beam restricting shutter which is disposed in a vicinity of an upstream of said poststage multipoints Faraday to block the ion beam, and which has a side that is substantially parallel to the x direction, and a poststage shutter driving apparatus which drives said poststage beam restricting shutter in the y direction, said ion beam measuring method comprising:

- a forestage beam current density distribution measuring step of, while driving said forestage multipoints Faraday in the y direction by said forestage Faraday driving apparatus, measuring a change of a beam current of the ion beam which is incident on said forestage multipoints Faraday, to obtain a beam current density distribution in the y direction of the ion beam at a position of said inlets of said forestage multipoints Faraday;
- a forestage beam size calculating step of, from the beam current density distribution obtained in said forestage beam current density distribution measuring step, obtaining a beam size $d_{yf}$ in the y direction of the ion beam at the position of said inlets of said forestage multipoints Faraday;
- a poststage beam current density distribution measuring step of, while driving said poststage beam restricting shutter in the y direction by said poststage shutter driving apparatus, measuring a change of a beam current of the ion beam which passes an outside of the side of said poststage beam restricting shutter, and which is incident on said poststage multipoints Faraday, to obtain a beam current density distribution in the y direction of the ion beam at a position of said poststage beam restricting shutter;
- a poststage beam size calculating step of, from the beam current density distribution obtained in said poststage beam current density distribution measuring step, obtaining a beam size $d_{yb}$ in the y direction of the ion beam at the position of said poststage beam restricting shutter; and
- a beam size calculating step of, from the beam size $d_{yf}$ obtained in said forestage beam size calculating step, the beam size $d_{yb}$ obtained in said poststage beam size calculating step, a distance L between said inlets of said forestage multipoints Faraday and said poststage beam restricting shutter, a distance $L_1$ between said inlets of said forestage multipoints Faraday and said target, and a distance $L_2$ between said target and said poststage beam restricting shutter, obtaining a beam size $d_{yt}$ in the y direction of the ion beam on said target, based on a following equation or an equation which is mathematically equivalent to the equation:

$$d_{yt}=(L_2/L)d_{yf}+(L_1/L)d_{yb} \text{ (where } L=L_1+L_2).$$

17. An ion beam measuring method according to claim 11 or 14, further comprising:

- a forestage beam size calculating step of, from the beam current density distribution obtained in said forestage beam current density distribution measuring step, obtaining a beam size $d_{yf}$ in the y direction of the ion beam at the position of said inlets of said forestage multipoints Faraday;

a poststage beam size calculating step of, from the beam current density distribution obtained in said poststage beam current density distribution measuring step, obtaining a beam size $d_{yb}$ in the y direction of the ion beam at the position of said poststage beam restricting shutter; and A diverging angle calculating step of, using the beam size $d_{yf}$ obtained in said forestage beam size calculating step, the beam size $d_{yb}$ obtained in said poststage beam size calculating step, and a distance L between said inlets of said forestage multipoints Faraday and said poststage beam restricting shutter, obtaining a diverging angle $\alpha_{max}$ in the y direction of the ion beam, based on a following equation or an equation which is mathematically equivalent to the equation:

$$\alpha_{max} = \tan^{-1}\{(d_{yb} - d_{yf})/2L\}.$$

18. An ion beam measuring method according to claim 17, further comprising:

a beam size calculating step of, from the beam size $d_{yf}$ obtained in said forestage beam size calculating step, the beam size $d_{yb}$ obtained in said poststage beam size calculating step, the distance L between said inlets of said forestage multipoints Faraday and said poststage beam restricting shutter, a distance $L_1$ between said inlets of said forestage multipoints Faraday and said target, and a distance $L_2$ between said target and said poststage beam restricting shutter, obtaining a beam size $d_{yt}$ in the y direction of the ion beam on said target, based on a following equation or an equation which is mathematically equivalent to the equation:

$$d_{yt} = (L_2/L)d_{yf} + (L_1/L)d_{yb} \text{ (where } L = L_1 + L_2).$$

19. An ion implanting apparatus for, through scanning in x direction, or not through scanning in x direction, irradiating a target with an ion beam which has a ribbon-like shape where a size in x direction is larger than a size in y direction that is substantially orthogonal to the x direction, said ion implanting apparatus comprising:

a forestage multipoints Faraday and a poststage multipoints Faraday on upstream and downstream sides of said target, respectively, each of said forestage multipoints Faraday and said poststage multipoints Faraday being configured by juxtaposing in the x direction plural detectors which measure a beam current of the ion beam, at least one of lines respectively connecting together upper ends and lower ends of plural inlets of said forestage multipoints Faraday being substantially parallel to the x direction;

a mask which is disposed in a vicinity of an upstream of said forestage multipoints Faraday, and which has an aperture through which the ion beam passes;

a forestage Faraday driving apparatus which drives said forestage multipoints Faraday in the y direction;

a poststage beam restricting shutter which is disposed in a vicinity of an upstream of said poststage multipoints Faraday to block the ion beam, and which has a side that is substantially parallel to the x direction;

a poststage shutter driving apparatus which drives said poststage beam restricting shutter in the y direction; and a control apparatus which performs: (a) a forestage beam current density distribution measuring process of, while driving said forestage multipoints Faraday in the y direction by said forestage Faraday driving apparatus, measuring a change of a beam current of the ion beam which passes said aperture of said mask, and which is incident on said forestage multipoints Faraday, to obtain a beam current density distribution in the y direction of the ion beam at aposition of said inlets of said forestage multipoints Faraday; (b) a forestage center position calculating process of, from the beam current density distribution obtained in said forestage beam current density distribution measuring process, obtaining a center position $y_{cf}$ in the y direction of the ion beam at the position of said inlets of said forestage multipoints Faraday; (c) a poststage beam current density distribution measuring process of, while driving said poststage beam restricting shutter in the y direction by said poststage shutter driving apparatus, measuring a change of a beam current of the ion beam which passes an outside of the side of said poststage beam restricting shutter, and which is incident on said poststage multipoints Faraday, to obtain a beam current density distribution in the y direction of the ion beam at a position of said poststage beam restricting shutter; (d) a poststage center position calculating process of, from the beam current density distribution obtained in said poststage beam current density distribution measuring process, obtaining a center position $y_{cb}$ in the y direction of the ion beam at the position of said poststage beam restricting shutter; and (e) an angle deviation calculating process of, using the center position $y_{cf}$ obtained in said forestage center position calculating process, the center position $y_{cb}$ obtained in said poststage center position calculating process, and a distance L between said inlets of said forestage multipoints Faraday and said poststage beam restricting shutter, obtaining an angle deviation $\theta_y$ in the y direction of the ion beam, based on a following equation or an equation which is mathematically equivalent to the equation:

$$\theta_y = \tan^{-1}\{(y_{cb} - y_{cf})/L\}.$$

20. An ion implanting apparatus for, through scanning in x direction, or not through scanning in x direction, irradiating a target with an ion beam which has a ribbon-like shape where a size in x direction is larger than a size in y direction that is substantially orthogonal to the x direction, said ion implanting apparatus comprising:

a forestage multipoints Faraday and a poststage multipoints Faraday on upstream and downstream sides of said target, respectively, each of said forestage multipoints Faraday and said poststage multipoints Faraday being configured by juxtaposing in the x direction plural detectors which measure a beam current of the ion beam, at least one of lines respectively connecting together upper ends and lower ends of plural inlets of said forestage multipoints Faraday being substantially parallel to the x direction;

a mask which is disposed in a vicinity of an upstream of said forestage multipoints Faraday, and which has an aperture through which the ion beam passes;

a forestage Faraday driving apparatus which drives said forestage multipoints Faraday in the y direction;

a poststage beam restricting shutter which is disposed in a vicinity of an upstream of said poststage multipoints Faraday to block the ion beam, and which has a side that is substantially parallel to the x direction;

a poststage shutter driving apparatus which drives said poststage beam restricting shutter in the y direction; and a control apparatus which performs: (a) a forestage beam current density distribution measuring process of, while driving said forestage multipoints Faraday in the y direction by said forestage Faraday driving apparatus, measuring a change of a beam current of the ion beam which passes said aperture of said mask, and which is incident on said forestage multipoints Faraday, to obtain a beam current density distribution in the y direction of the ion beam at a position of said inlets of said forestage multipoints Faraday; (b) a forestage beam size calculating process of, from the beam current density distribution obtained in said forestage beam current density distribution measuring process, obtaining a beam size $d_{yf}$ in the y direction of the ion beam at the position of said inlets of said forestage multipoints Faraday; (c) a poststage beam current density distribution measuring process of, while driving said poststage beam restricting shutter in the y direction by said poststage shutter driving apparatus, measuring a change of a beam current of the ion beam which passes an outside of the side of said poststage beam restricting shutter, and which is incident on said poststage multipoints Faraday, to obtain a beam current density distribution in the y direction of the ion beam at a position of said poststage beam restricting shutter; (d) a poststage beam size calculating process of, from the beam current density distribution obtained in said poststage beam current density distribution measuring process, obtaining a beam size $d_{yb}$ in the y direction of the ion beam at the position of said poststage beam restricting shutter; and (e) a diverging angle calculating process of, using the beam size $d_{yf}$ obtained in said forestage beam size calculating process, the beam size $d_{yb}$ obtained in said poststage beam size calculating process, and a distance L between said inlets of said forestage multipoints Faraday and said poststage beam restricting shutter, obtaining a diverging angle $\alpha_{max}$ in the y direction of the ion beam, based on a following equation or an equation which is mathematically equivalent to the equation:

$$\alpha_{max} = \tan^{-1}\{(d_{yb} - d_{yf})/2L\}.$$

21. An ion implanting apparatus for, through scanning in x direction, or not through scanning in x direction, irradiating a target with an ion beam which has a ribbon-like shape where a size in x direction is larger than a size in y direction that is substantially orthogonal to the x direction, said ion implanting apparatus comprising:

a forestage multipoints Faraday and a poststage multipoints Faraday on upstream and downstream sides of said target, respectively, each of said forestage multipoints Faraday and said poststage multipoints Faraday being configured by juxtaposing in the x direction plural detectors which measure a beam current of the ion beam, at least one of lines respectively connecting together upper ends and lower ends of plural inlets of said forestage multipoints Faraday being substantially parallel to the x direction;

a mask which is disposed in a vicinity of an upstream of said forestage multipoints Faraday, and which has an aperture through which the ion beam passes;

a forestage Faraday driving apparatus which drives said forestage multipoints Faraday in the y direction;

a poststage beam restricting shutter which is disposed in a vicinity of an upstream of said poststage multipoints Faraday to block the ion beam, and which has a side that is substantially parallel to the x direction;

a poststage shutter driving apparatus which drives said poststage beam restricting shutter in the y direction; and a control apparatus which performs: (a) a forestage beam current density distribution measuring process of, while driving said forestage multipoints Faraday in the y direction by said forestage Faraday driving apparatus, measuring a change of a beam current of the ion beam which passes said aperture of said mask, and which is incident on said forestage multipoints Faraday, to obtain a beam current density distribution in the y direction of the ion beam at a position of said inlets of said forestage multipoints Faraday; (b) a forestage beam size calculating process of, from the beam current density distribution obtained in said forestage beam current density distribution measuring process, obtaining a beam size $d_{yf}$ in the y direction of the ion beam at the position of said inlets of said forestage multipoints Faraday; (c) a poststage beam current density distribution measuring process of, while driving said poststage beam restricting shutter in the y direction by said poststage shutter driving apparatus, measuring a change of a beam current of the ion beam which passes an outside of the side of said poststage beam restricting shutter, and which is incident on said poststage multipoints Faraday, to obtain a beam current density distribution in the y direction of the ion beam at a position of said poststage beam restricting shutter; (d) a poststage beam size calculating process of, from the beam current density distribution obtained in said poststage beam current density distribution measuring process, obtaining a beam size $d_{yb}$ in the y direction of the ion beam at the position of said poststage beam restricting shutter; and (e) a beam size calculating process of, from the beam size $d_{yf}$ obtained in said forestage beam size calculating process, the beam size $d_{yb}$ obtained in said poststage beam size calculating process, a distance L between said inlets of said forestage multipoints Faraday and said poststage beam restricting shutter, a distance $L_1$ between said inlets of said forestage multipoints Faraday and said target, and a distance $L_2$ between said target and said poststage beam restricting shutter, obtaining a beam size $d_{yt}$ in the y direction of the ion beam on said target, based on a following equation or an equation which is mathematically equivalent to the equation:

$$d_{yt} = (L_2/L)d_{yf} + (L_1/L)d_{yb} \text{ (where } L = L_1 + L_2\text{).}$$

22. An ion implanting apparatus for, through scanning in x direction, or not through scanning in x direction, irradiating a target with an ion beam which has a ribbon-like shape where a size in x direction is larger than a size in y direction that is substantially orthogonal to the x direction, said ion implanting apparatus comprising:

a forestage multipoints Faraday and a poststage multipoints Faraday on upstream and downstream sides of said target, respectively, each of said forestage multipoints Faraday and said poststage multipoints Faraday being configured by juxtaposing in the x direction plural detectors which measure a beam current of the ion beam, at least one of lines respectively connecting together upper ends and lower ends of plural inlets of said forestage multipoints Faraday being substantially parallel to the x direction;

a forestage Faraday driving apparatus which drives said forestage multipoints Faraday in the y direction;

a poststage beam restricting shutter which is disposed in a vicinity of an upstream of said poststage multipoints Faraday to block the ion beam, and which has a side that is substantially parallel to the x direction;

a poststage shutter driving apparatus which drives said poststage beam restricting shutter in the y direction; and a control apparatus which performs: (a) a forestage beam current density distribution measuring process of, while driving said forestage multipoints Faraday in the y direction by said forestage Faraday driving apparatus, measuring a change of a beam current of the ion beam which is incident on said forestage multipoints Faraday, to obtain a beam current density distribution in the y direction of the ion beam at a position of said inlets of said forestage multipoints Faraday; (b) a forestage center position calculating process of, from the beam current density distribution obtained in said forestage beam current density distribution measuring process, obtaining a center position $y_{cf}$ in the y direction of the ion beam at the position of said inlets of said forestage multipoints Faraday; (c) a poststage beam current density distribution measuring process of, while driving said poststage beam restricting shutter in the y direction by said poststage shutter driving apparatus, measuring a change of a beam current of the ion beam which passes an outside of the side of said poststage beam restricting shutter, and which is incident on said poststage multipoints Faraday, to obtain a beam current density distribution in the y direction of the ion beam at a position of said poststage beam restricting shutter; (d) a poststage center position calculating process of, from the beam current density distribution obtained in said poststage beam current density distribution measuring process, obtaining a center position $y_{cb}$ in the y direction of the ion beam at the position of said poststage beam restricting shutter; and (e) an angle deviation calculating process of, using the center position $y_{cf}$ obtained in said forestage center position calculating process, the center position $y_{cb}$ obtained in said poststage center position calculating process, and a distance L between said inlets of said forestage multipoints Faraday and said poststage beam restricting shutter, obtaining an angle deviation $\theta_y$ in the y direction of the ion beam, based on a following equation or an equation which is mathematically equivalent to the equation:

$$\theta_y = \tan^{-1}\{(y_{cb}-y_{cf})/L\}.$$

23. An ion implanting apparatus for, through scanning in x direction, or not through scanning in x direction, irradiating a target with an ion beam which has a ribbon-like shape where a size in x direction is larger than a size in y direction that is substantially orthogonal to the x direction, said ion implanting apparatus comprising:

a forestage multipoints Faraday and a poststage multipoints Faraday on upstream and downstream sides of said target, respectively, each of said forestage multipoints Faraday and said poststage multipoints Faraday being configured by juxtaposing in the x direction plural detectors which measure a beam current of the ion beam, at least one of lines respectively connecting together upper ends and lower ends of plural inlets of said forestage multipoints Faraday being substantially parallel to the x direction;

a forestage Faraday driving apparatus which drives said forestage multipoints Faraday in the y direction;

a poststage beam restricting shutter which is disposed in a vicinity of an upstream of said poststage multipoints Faraday to block the ion beam, and which has a side that is substantially parallel to the x direction;

a poststage shutter driving apparatus which drives said poststage beam restricting shutter in the y direction; and a control apparatus which performs: (a) a forestage beam current density distribution measuring process of, while driving said forestage multipoints Faraday in the y direction by said forestage Faraday driving apparatus, measuring a change of a beam current of the ion beam which is incident on said forestage multipoints Faraday, to obtain a beam current density distribution in the y direction of the ion beam at a position of said inlets of said forestage multipoints Faraday; (b) a forestage beam size calculating process of, from the beam current density distribution obtained in said forestage beam current density distribution measuring process, obtaining a beam size $d_{yf}$ in the y direction of the ion beam at the position of said inlets of said forestage multipoints Faraday; (c) a poststage beam current density distribution measuring process of, while driving said poststage beam restricting shutter in the y direction by said poststage shutter driving apparatus, measuring a change of a beam current of the ion beam which passes an outside of the side of said poststage beam restricting shutter, and which is incident on said poststage multipoints Faraday, to obtain a beam current density distribution in the y direction of the ion beam at a position of said poststage beam restricting shutter; (d) a poststage beam size calculating process of, from the beam current density distribution obtained in said poststage beam current density distribution measuring process, obtaining a beam size $d_{yb}$ in the y direction of the ion beam at the position of said poststage beam restricting shutter; and (e) a diverging angle calculating process of, using the beam size $d_{yf}$ obtained in said forestage beam size calculating process, the beam size $d_{yb}$ obtained in said poststage beam size calculating process, and a distance L between said inlets of said forestage multipoints Faraday and said poststage beam restricting shutter, obtaining a diverging angle $\alpha_{max}$ in the y direction of the ion beam, based on a following equation or an equation which is mathematically equivalent to the equation:

$$\alpha_{max} = \tan^{-1}\{(d_{yb}-d_{yf})/2L\}.$$

24. An ion implanting apparatus for, through scanning in x direction, or not through scanning in x direction, irradiating a target with an ion beam which has a ribbon-like shape where a size in x direction is larger than a size in y direction that is substantially orthogonal to the x direction, said ion implanting apparatus comprising:

a forestage multipoints Faraday and a poststage multipoints Faraday on upstream and downstream sides of said target, respectively, each of said forestage multipoints Faraday and said poststage multipoints Faraday being configured by juxtaposing in the x direction plural detectors which measure a beam current of the ion beam, at least one of lines respectively connecting together upper ends and lower ends of plural inlets of said forestage multipoints Faraday being substantially parallel to the x direction;

a forestage Faraday driving apparatus which drives said forestage multipoints Faraday in the y direction;

a poststage beam restricting shutter which is disposed in a vicinity of an upstream of said poststage multipoints Faraday to block the ion beam, and which has a side that is substantially parallel to the x direction;

a poststage shutter driving apparatus which drives said poststage beam restricting shutter in the y direction; and a control apparatus which performs: (a) a forestage beam current density distribution measuring process of, while driving said forestage multipoints Faraday in the y direction by said forestage Faraday driving apparatus, measuring a change of a beam current of the ion beam which is incident on said forestage multipoints Faraday, to obtain a beam current density distribution in the y direction of the ion beam at a position of said inlets of said forestage multipoints Faraday; (b) a forestage beam size calculating process of, from the beam current density distribution obtained in said forestage beam current density distribution measuring process, obtaining a beam size $d_{yf}$ in the y direction of the ion beam at the position of said inlets of said forestage multipoints Faraday; (c) a poststage beam current density distribution measuring process of, while driving said poststage beam restricting shutter in the y direction by said poststage shutter driving apparatus, measuring a change of a beam current of the ion beam which passes an outside of the side of said poststage beam restricting shutter, and which is incident on said poststage multipoints Faraday, to obtain a beam current density distribution in the y direction of the ion beam at a position of said poststage beam restricting shutter; (d) a poststage beam size calculating process of, from the beam current density distribution obtained in said poststage beam current density distribution measuring process, obtaining a beam size $d_{yb}$ in the y direction of the ion beam at the position of said poststage beam restricting shutter; and (e) a beam size calculating process of, from the beam size $d_{yf}$ obtained in said forestage beam size calculating process, the beam size $d_{yb}$ obtained in said poststage beam size calculating process, a distance L between said inlets of said forestage multipoints Faraday and said poststage beam restricting shutter, a distance $L_1$ between said inlets of said forestage multipoints Faraday and said target, and a distance $L_2$ between said target and said poststage beam restricting shutter, obtaining a beam size $d_{yt}$ in the y direction of the ion beam on said target, based on a following equation or an equation which is mathematically equivalent to the equation:

$$d_{yt}=(L_2/L)d_{yf}+(L_1/L)d_{yb} \text{ (where } L=L_1+L_2).$$

25. An ion implanting apparatus according to claim 19 or 22, wherein said control apparatus further performs: (f) a forestage beam size calculating process of, from the beam current density distribution obtained in said forestage beam current density distribution measuring process, obtaining a beam size $d_{yf}$ in the y direction of the ion beam at the position of said inlets of said forestage multipoints Faraday; (g) a poststage beam size calculating process of, from the beam current density distribution obtained in said poststage beam current density distribution measuring process, obtaining a beam size $d_{yb}$ in the y direction of the ion beam at the position of said poststage beam restricting shutter; and (h) a diverging angle calculating process of, using the beam size $d_{yf}$ obtained in said forestage beam size calculating process, the beam size $d_{yb}$ obtained in said poststage beam size calculating process, and a distance L between said inlets of said forestage multipoint Faraday and said poststage beam restricting shutter, obtaining a diverging angle $\alpha_{max}$ in the y direction of the ion beam, based on a following equation or an equation which is mathematically equivalent to the equation:

$$\alpha_{max}=\tan^{-1}\{(d_{yb}-d_{yf})/2L\}.$$

26. An ion implanting apparatus according to claim 25, wherein said control apparatus further performs: (i) a beam size calculating process of, from the beam size $d_{yf}$ obtained in said forestage beam size calculating process, the beam size $d_{yb}$ obtained in said poststage beam size calculating process, the distance L between said inlets of said forestage multipoints Faraday and said poststage beam restricting shutter, a distance $L_1$ between said inlets of said forestage multipoints Faraday and said target, and a distance $L_2$ between said target and said poststage beam restricting shutter, obtaining a beam size $d_{yt}$ in the y direction of the ion beam on said target, based on a following equation or an equation which is mathematically equivalent to the equation:

$$d_{yt}=(L_2/L)d_{yf}+(L_1/L)d_{yb} \text{ (where } L=L_1+L_2).$$

* * * * *